US007855124B2

(12) United States Patent
Tsai et al.

(10) Patent No.: US 7,855,124 B2
(45) Date of Patent: Dec. 21, 2010

(54) METHOD FOR FORMING A SEMICONDUCTOR DEVICE

(75) Inventors: Hung-Ming Tsai, Taoyuan (TW); Ching-Nan Hsiao, Taoyuan (TW); Chung-Lin Huang, Taoyuan (TW)

(73) Assignee: Nanya Technology Corp., Taiwan (CN)

( * ) Notice: Subject to any disclaimer, the term of this patent is extended or adjusted under 35 U.S.C. 154(b) by 533 days.

(21) Appl. No.: 12/035,529

(22) Filed: Feb. 22, 2008

(65) Prior Publication Data

US 2009/0124059 A1 May 14, 2009

(30) Foreign Application Priority Data

Nov. 14, 2007 (TW) .............................. 96142983 A

(51) Int. Cl.
*H01L 21/76* (2006.01)

(52) U.S. Cl. ................................ 438/424; 257/E21.54

(58) Field of Classification Search ................. 438/424; 257/E21.54

See application file for complete search history.

(56) References Cited

U.S. PATENT DOCUMENTS 6,153,471 A * 11/2000 Lee et al. .................... 438/263
2005/0064666 A1* 3/2005 Kim ........................... 438/286
2005/0156225 A1* 7/2005 Ahn et al. ................... 257/316
2008/0090354 A1* 4/2008 Baek et al. .................. 438/264
2008/0265304 A1* 10/2008 Lee et al. .................... 257/316
2009/0011588 A1* 1/2009 Kim ........................... 438/594

* cited by examiner

*Primary Examiner*—David A Zameke
*Assistant Examiner*—Igwe U Anya
(74) *Attorney, Agent, or Firm*—Ingrassia Fisher & Lorenz, P.C.

(57) ABSTRACT

A method for forming a semiconductor device, includes the steps of providing a substrate; forming a patterned stack on the substrate including a first dielectric layer on the substrate, a first conductive layer on the first dielectric layer and a mask layer on the first conductive layer, wherein a width of the mask layer is smaller than a width of the first conductive layer; forming a second dielectric layer on the sidewall of the patterned stack; forming a third dielectric layer on the substrate; forming a second conductive layer over the substrate; and removing the mask layer and a portion of the first conductive layer covered by the mask layer to form an opening so as to partially expose the first conductive layer.

20 Claims, 32 Drawing Sheets

METHOD FOR FORMING A SEMICONDUCTOR DEVICE

CROSS REFERENCE TO RELATED APPLICATIONS

This application claims the right of priority based on Taiwan Patent Application No. 96142983 entitled "Method for Forming Semiconductor Device," filed on Nov. 14, 2007, which is incorporated herein by reference and assigned to the assignee herein.

FIELD OF THE INVENTION

The present invention relates to a method for forming a semiconductor device, and more particularly, relates to a method for forming a memory device.

BACKGROUND OF THE INVENTION

The fabrication of semiconductor circuits generally repeatedly performs a series of processes including lithography, deposition, etching, and the like to form layer-stacked integrated circuits. However, as the feature size of the semiconductor device reduces, the complexity of conventional methods, and the parameters of etching processes for various materials become more and more difficult to control, such that the breakdown rate increases due to inappropriate control of etching rate or voltage.

Conventional methods for forming memory devices generally include patterning a gate conductor, wherein a mask layer is removed, and then a spacer is formed to define the gate conductor. However, because the spacer having a curved shape causes the etching process more difficult to control, the edge of the gate conductor may be damaged during the process of removing the spacer.

Therefore, it is desired to provide a method for forming a semiconductor structure, which reduces the required steps and avoids the edge damage of the gate conductor clarity patterning the gate conductor, and defines floating gates of the memory device by using a self-aligned manner.

SUMMARY OF THE INVENTION

One aspect of the present invention is to provide a method for forming a semiconductor device, which includes forming a spacer with a well-controlled pattern profile to avoid the edge damage of the gate conductor, where the edge damage inevitably occurs in the conventional processes.

Another aspect of the present invention is to provide a method for forming a semiconductor device, which has floating gates with a good profile control on two sides of the control gate, so that the coupling ratio is effectively increased and the performance of the semiconductor device is improved.

A further aspect of the present invention is to provide a method for forming a semiconductor device, which reduces the width of the mask layer to a desired level to self-alignedly define the floating gate of the memory device.

In a preferred embodiment, the present invention provides a method for forming a semiconductor device. The method includes providing a substrate; forming on the substrate a patterned stack including a first dielectric layer, a first conductive layer on the first dielectric layer, and a mask layer on the first conductive layer, wherein a width of the mask layer is smaller than a width of the first conductive layer; forming a second dielectric layer on sidewalls of the patterned stack; forming a third dielectric layer on the substrate; forming a second conductive layer over the substrate; and removing the mask layer and a portion of the first conductive layer covered by the mask layer to form an opening so as to partially expose the first conductive layer.

In an exemplary embodiment, the step of forming the patterned stack includes forming dielectric isolations in the first conductive layer, the first dielectric layer, and the substrate before forming the mask layer. For example, the step of forming the dielectric isolations includes forming a plurality of parallel trenches in the first conductive layer, the first dielectric layer, and the substrate along a first direction; filling the trenches with a dielectric material to form the dielectric isolations; and planarizing the dielectric isolations, so that the dielectric isolations and the first conductive layer are substantially coplanar.

In an embodiment, the step of forming the patterned stack includes forming a patterned photoresist on the mask layer, the patterned photoresist defining an opening along a second direction perpendicular to the first direction; etching the mask layer to expose a portion of the first conductive layer by using the patterned photoresist as a mask; forming a spacer on sidewalls of the mask layer; etching the first conductive layer and the first dielectric layer to expose the substrate by using the spacer and the mask layer as a mask; and removing the spacer to form the patterned stack. In an exemplary embodiment, the method further includes laterally etching back the mask layer before the step of forming the spacer.

In another embodiment of the present invention, before removing the mask layer and a portion of the first conductive layer covered by the mask layer, the method for forming a semiconductor device, further includes: etching back the second conductive layer, so that a surface of the second conductive layer is lower than a surface of the mask layer; and forming a protective layer on the second conductive layer to expose the mask layer. In an embodiment, the method further includes thermally oxidizing the first conductive layer to form a liner on sidewalls of the remaining portion of the first conductive layer. Moreover, the method includes forming an interlayer dielectric layer filling the opening and covering the second conductive layer.

BRIEF DESCRIPTION OF THE DRAWINGS

FIGS. 11, 11A, 1B, 11C and 11D are a top view and cross-sectional views taken along lines A-A', B-B', C-C' and D-D' of FIG. 1, respectively, showing the step of forming an interlayer dielectric layer in the method of forming a semiconductor device according to one embodiment of the present invention.

DETAILED DESCRIPTION OF THE INVENTION

Figure 1:
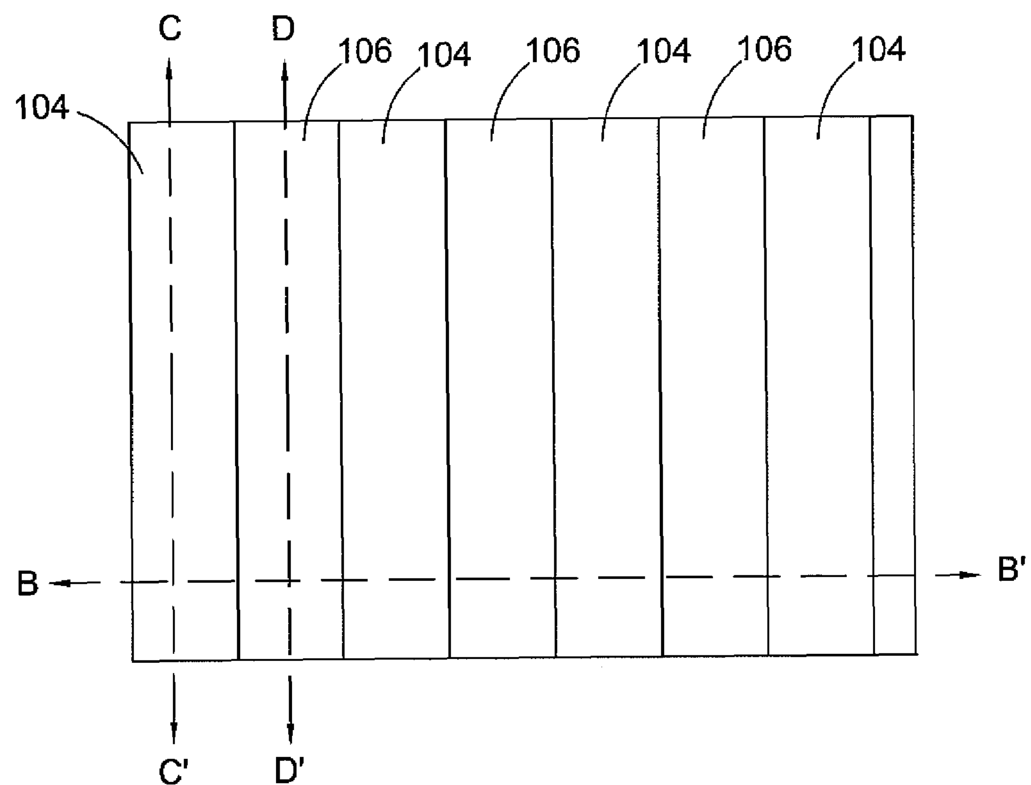
FIGS. 1, 1B, 1C and 1D are a top view and cross-sectional views taken along lines B-B', C-C' and D-D' of FIG. 1, respectively, showing the step of forming dielectric isolations in a method of forming a semiconductor device according to one embodiment of the present invention.

The present invention provides a method for forming a semiconductor device, which can avoid the edge damage of the gate conductor. The present invention will now be described in detail with reference to the attached drawings of FIG. 1 to FIG. 11. The description sets forth various preferred embodiments of the present invention only, and is not intended to limit the scope, applicability, or configuration of the invention in any way. The layers described below can be formed by conventional techniques including lithography (such as coating, exposing, developing, etc.), etching (such as dry etching, wet etching, reactive ion etching, etc.), deposition (such as chemical vapor deposition, physical vapor deposition, plasma enhanced deposition, etc.), thermal process (such as thermal oxidation, annealing, thermal diffusion, etc.), polishing (such as chemical mechanical polishing, etc.), and implant (such as ion implantation, etc.) and the likes, which are well known in the art and not deliberated hereinafter. Moreover, the same or similar reference numbers will be used throughout the drawings to refer to the same or similar features, and features of the invention are not necessarily drawn to scale in the drawings.

FIGS. 1, 1B, 1C and 1D are top view and cross-sectional views taken along lines B-B', C-C' and D-D' of FIG. 1, showing the step of forming dielectric isolations 106 in a method of forming a semiconductor device according to one embodiment of the present invention. In one embodiment, the present invention provides a method for forming a semiconductor device. The method includes a step of providing a substrate 100, which can be any substrate for forming a semiconductor device. The substrate 100 can be, for example, a silicon substrate, a silicon-on-insulator (SOI) substrate, a silicon germanium substrate, a silicon-germanium-on-insulator substrate (SGeOI), and the like. In this embodiment, the substrate 100 is illustrated as a silicon substrate. A first dielectric layer 102 is then formed on the substrate 100. The step of forming the first dielectric layer 102 includes thermally oxidizing the substrate 100 to form the first dielectric layer 102 functioning as a gate dielectric layer of the semiconductor device, such as a gate oxide layer of a memory device. Then, a first conductive layer 104 is formed on the first dielectric layer 102 functioning as a gate of the semiconductor device, such as a floating gate of a memory device. In one embodiment, the first conductive layer 104 may be a polysilicon layer or a doped polysilicon layer, and may be formed by a chemical vapor deposition (CVD) process.

Figure 1B:
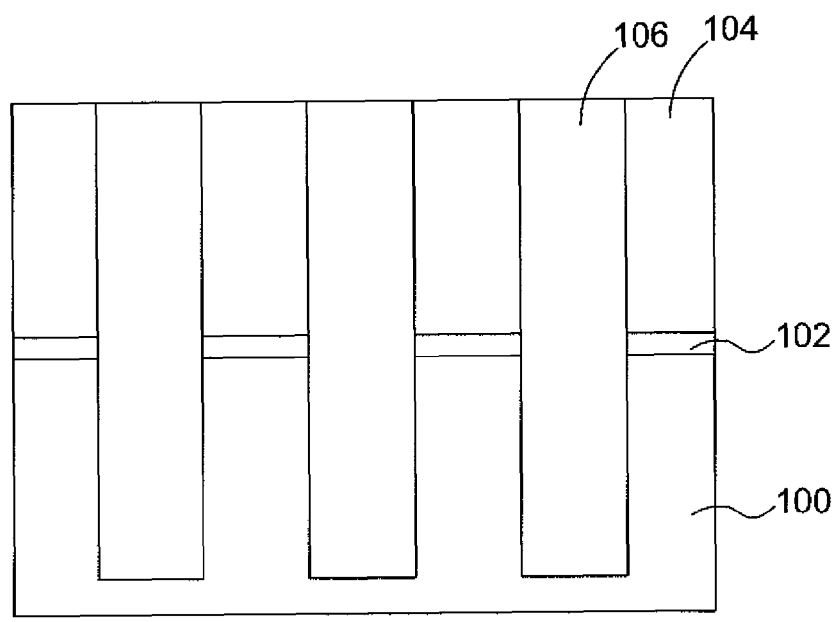
Figure 1C:
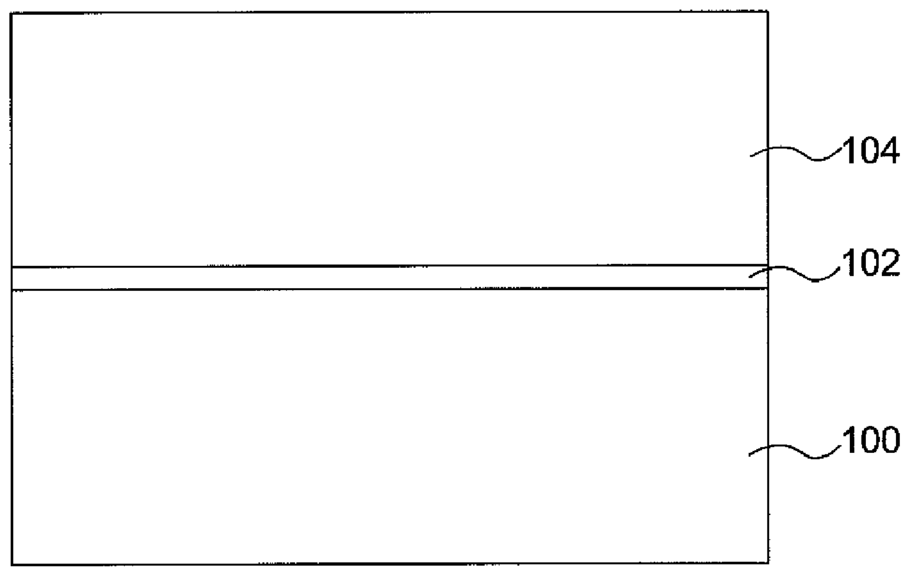
Figure 1D:
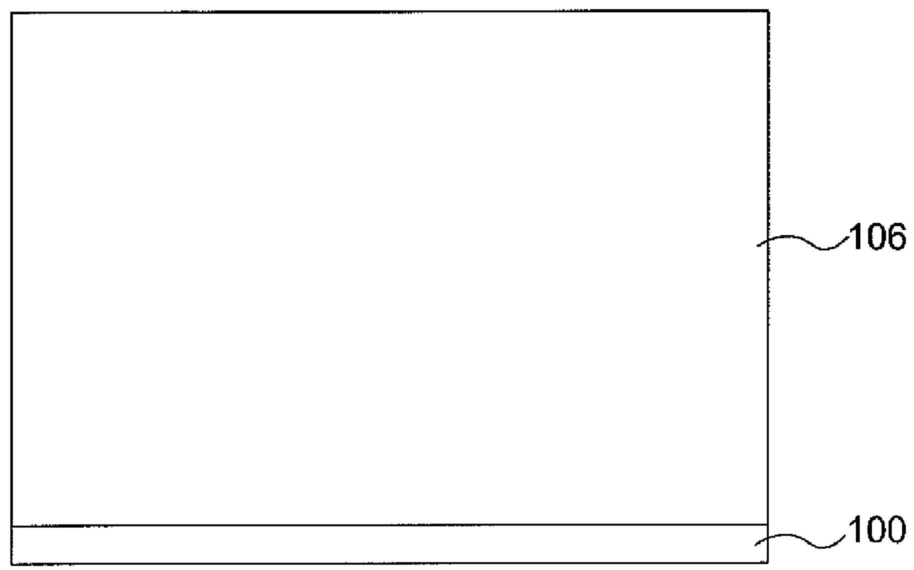

As shown in FIG. 1 and FIGS. 1B to 1D, dielectric isolations 106 (e.g. shallow trench isolations) are formed in the substrate 100, wherein the dielectric isolations 106 and the first conductive layer 104 are substantially coplanar. In an exemplary embodiment, the step of forming the dielectric isolations 106 includes forming a plurality of parallel trenches in the first conductive layer 104, the first dielectric layer 102, and the substrate 100 along a first direction (i.e. line D-D' of FIG. 1). The step of forming the parallel trenches includes conventional lithography and etching techniques. For example, a photoresist layer is first provided on top of the substrate, and then developed to form a patterned photoresist with a trench pattern. Then, by using the patterned photoresist as a mask, the first conductive layer 104, the first dielectric layer 102, and the substrate 100 are etched to form trenches in the first conductive layer 104, the first dielectric layer 102, and the substrate 100. Subsequently, the trenches are filled with a dielectric material to form the dielectric isolations 106. The trenches may be filled by blanket-depositing a dielectric material (such as oxide) over the substrate 100, and the dielectric material preferably is deposited by utilizing a high-density plasma chemical vapor deposition (HDP-CVD) process. Then, the dielectric isolations 106 are planarized to expose the first conductive layer 104 by a chemical mechanical polishing process. Preferably, the chemical mechanical polishing process is performed to polish the dielectric isolations 106, so that the dielectric isolations 106 and the first conductive layer 104 are substantially coplanar, as shown in FIG. 1B.

Figure 2:
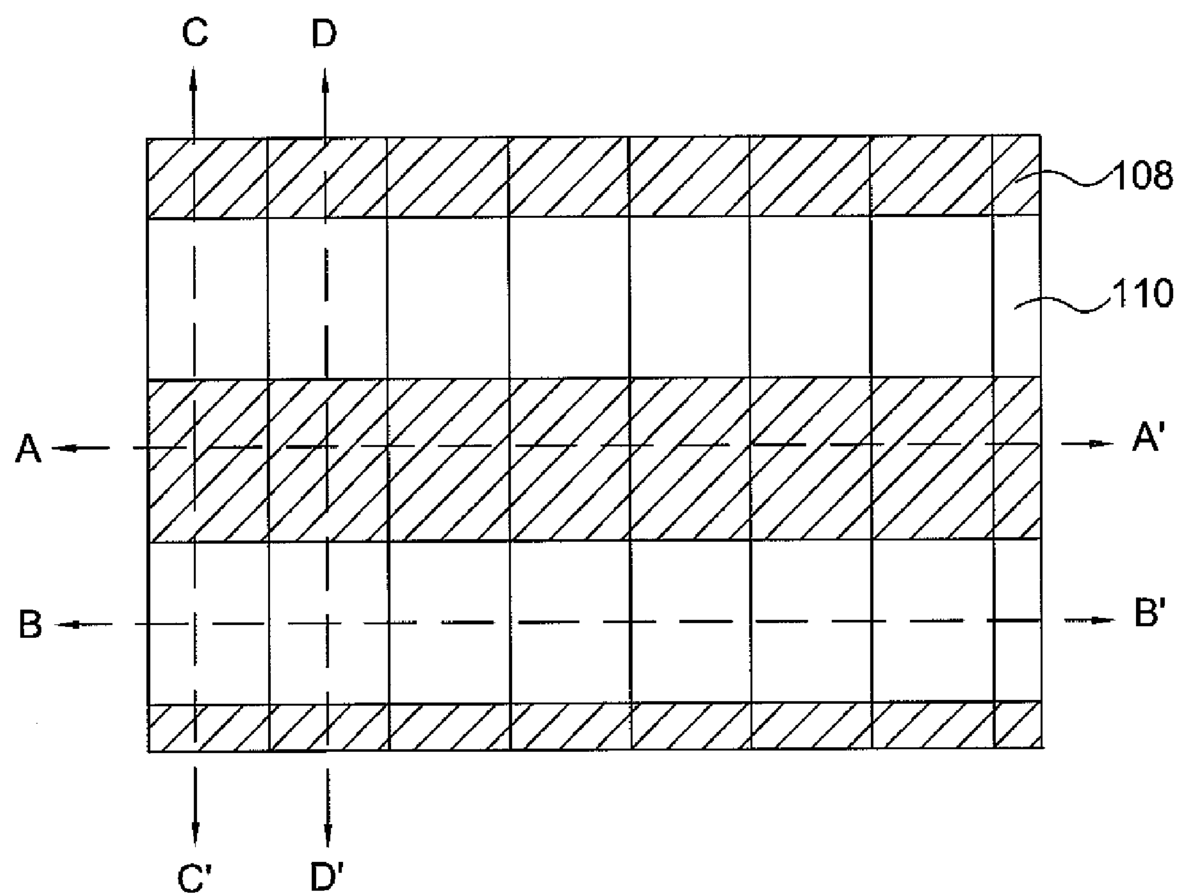
FIGS. 2, 2A, 2B, 2C and 2D are a top view and cross-sectional views taken along lines A-A', B-B', C-C' and D-D' of FIG. 2, respectively, showing the step of forming a patterned photoresist in the method of forming a semiconductor device according to one embodiment of the present invention.
Figure 2A:
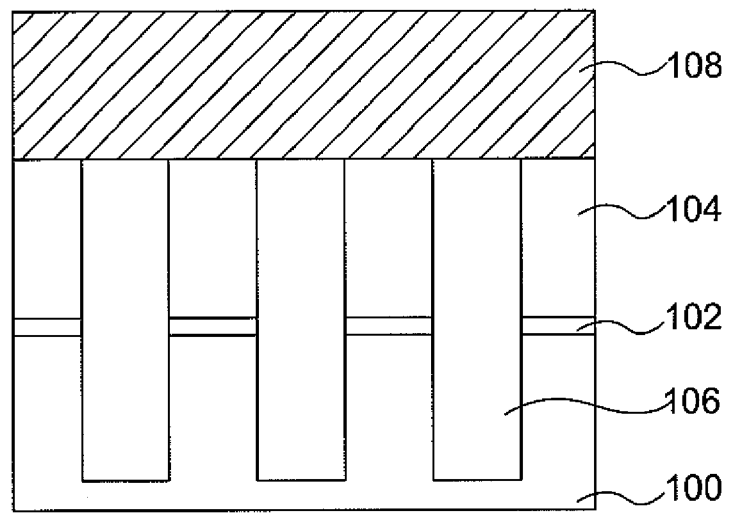
Figure 2B:
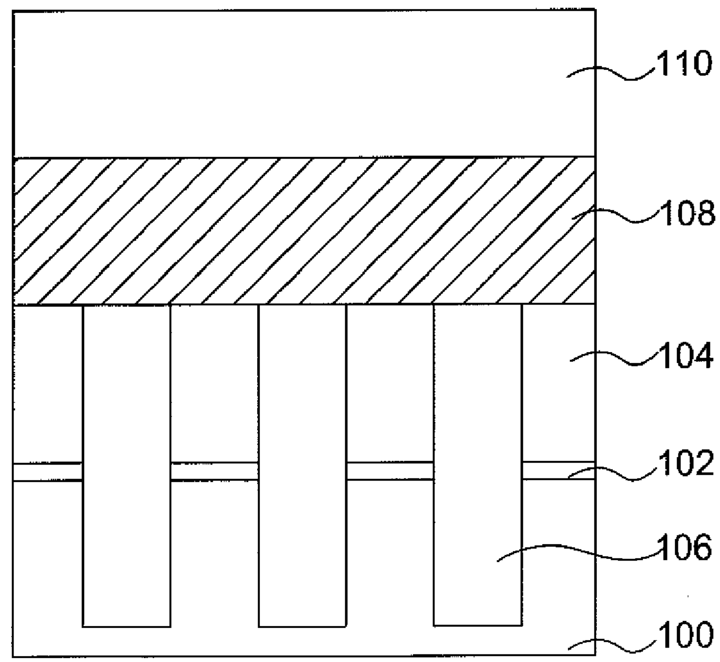
Figure 2C:
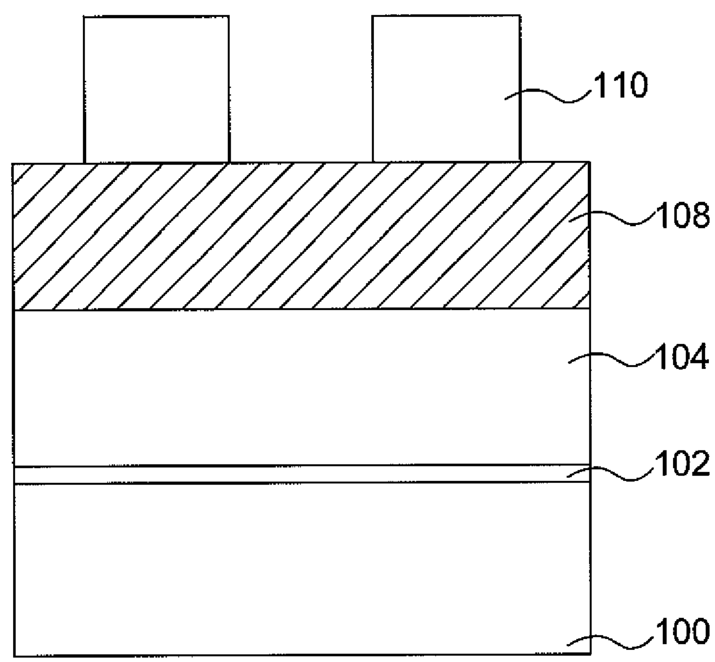
Figure 2D:
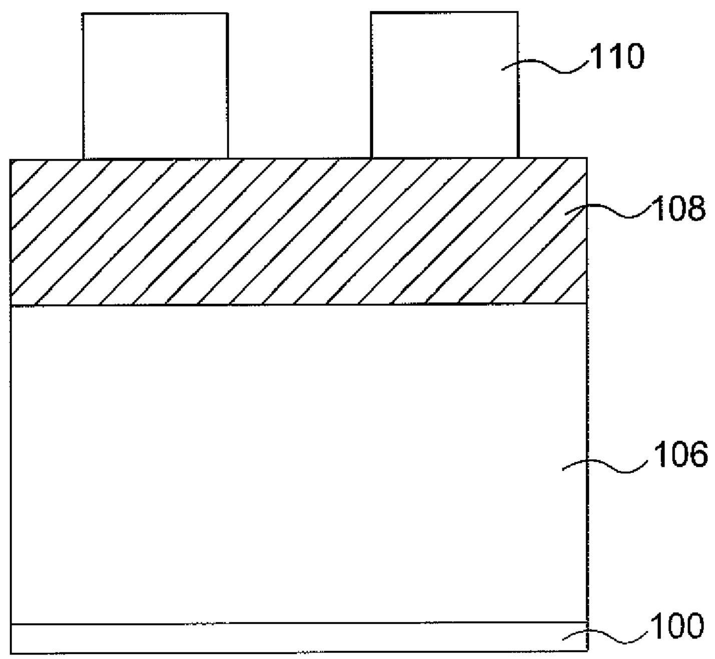

FIGS. 2, 2A, 2B, 2C and 2D are top and cross-sectional views taken along lines A-A', B-B', C-C' and D-D' of FIG. 2, respectively, showing the step of forming a patterned photoresist 110 in the method of forming a semiconductor device according to one embodiment of the present invention. As shown in these figures, a mask layer 108 is formed on the structure having therein dielectric isolations 106 of FIG. 1. In one embodiment, the mask layer 108 may be formed by blanket-depositing a nitride layer, and preferably a silicon nitride layer, such as SiN, Si3N4. The thickness of the mask layer 108 can be adjusted depending on the design needs. Then, a patterned photoresist 110 is formed on the mask layer 108 to define openings along a second direction (i.e. line B-B' in FIG. 2) perpendicular to the first direction (i.e. line D-D' in FIG. 2), so that the location of a gate of the semiconductor device is defined.

Figure 3:
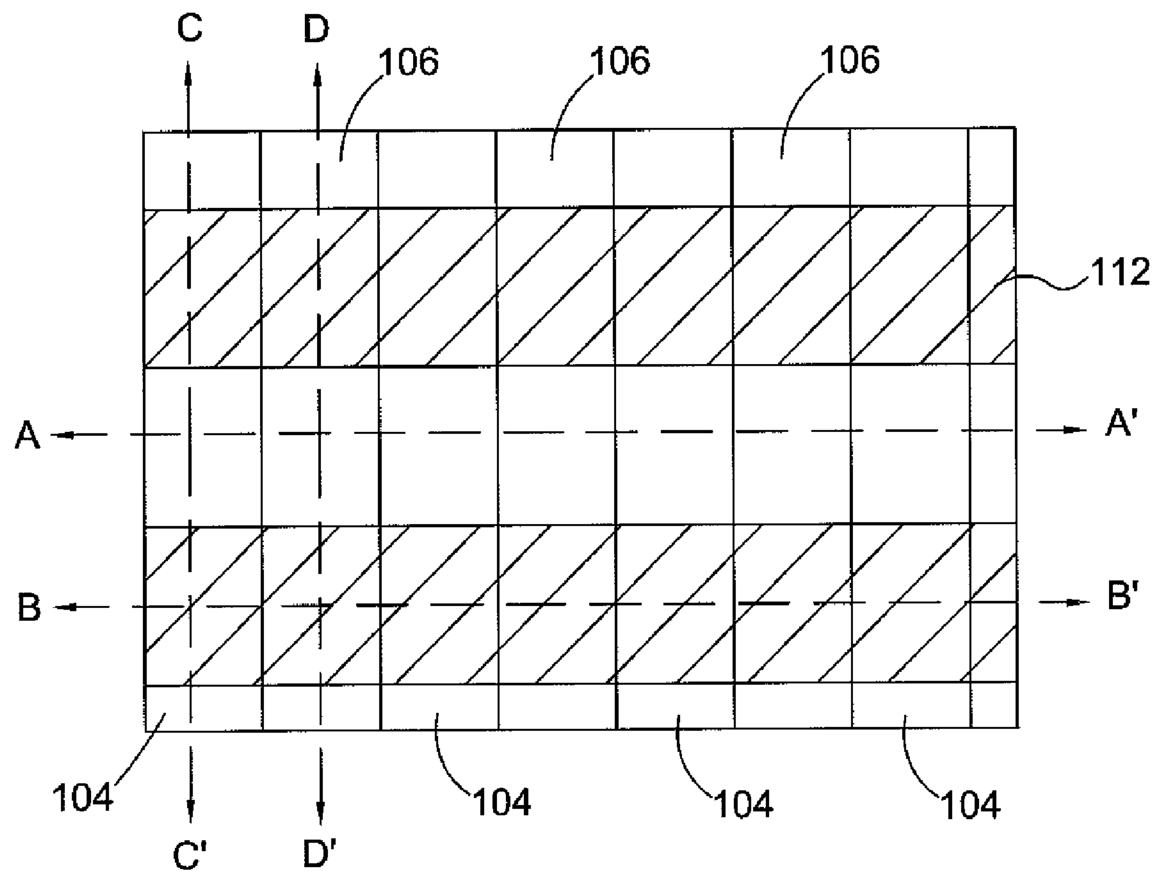
FIGS. 3, 3A, 3B, 3C and 3D are a top view and cross-sectional views taken along lines A-A', B-B', C-C' and D-D' of FIG. 3, respectively, showing the step of patterning the mask layer in the method of forming a semiconductor device according to one embodiment of the present invention.
Figure 3A:
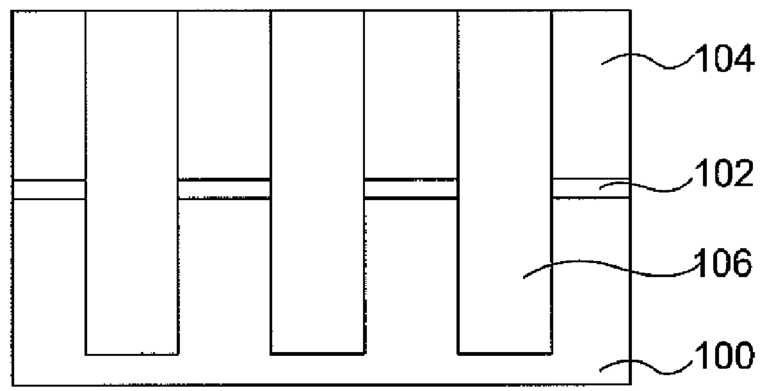
Figure 3B:
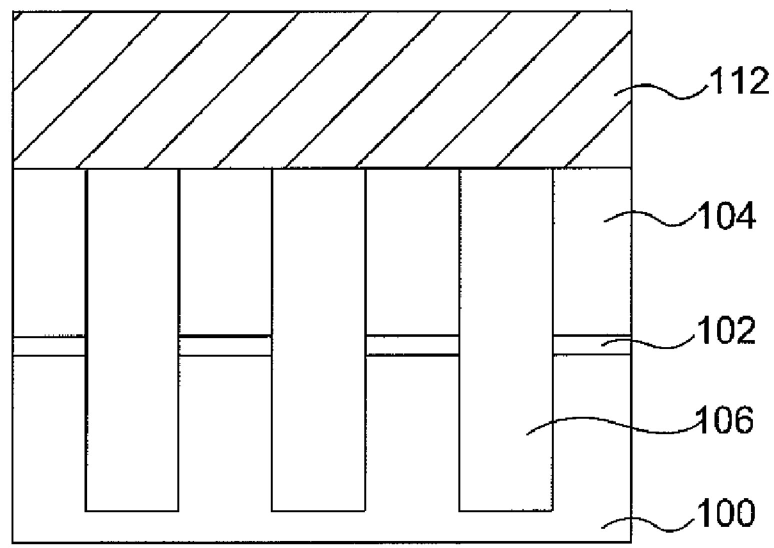

FIGS. 3, 3A, 3B, 3C and 3D are top and cross-sectional views taken along lines A-A', B-B', C-C' and D-D' of FIG. 3, respectively, showing the step of patterning the mask layer 108 in the method of forming a semiconductor device according to one embodiment of the present invention. As shown in the figures, the mask layer 108 is etched to expose a portion of the first conductive layer 104 by using the patterned photoresist 110 as a mask, and then the patterned photoresist 110 is removed. Note that the retained portion of the patterned mask layer 108 on the first conductive layer 104 is defined as a patterned mask layer 112. In this embodiment, the step of removing the mask layer 108 is preferably performed by an anisotropical etching process, such as, but is not limited to, a reactive ion etching process.

Figure 3C:
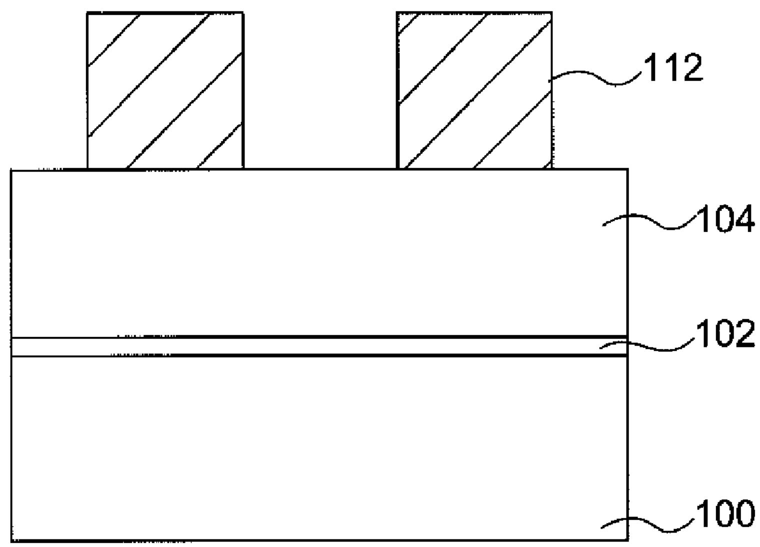
Figure 3D:
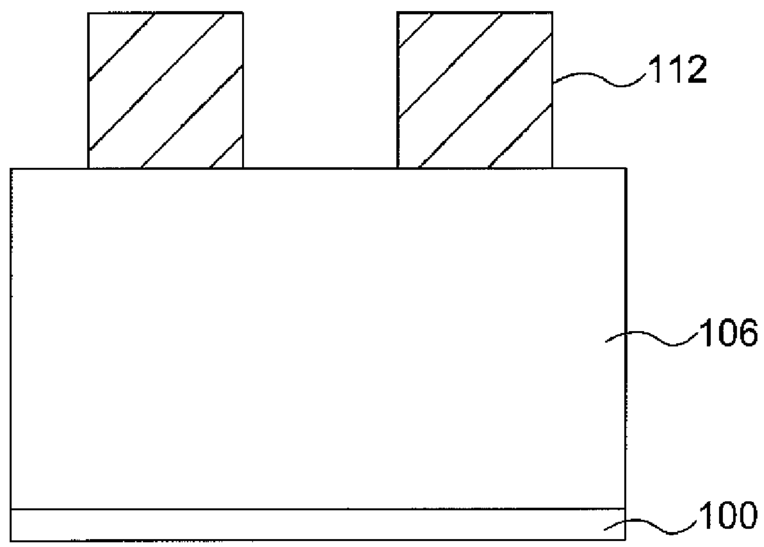
Figure 4:
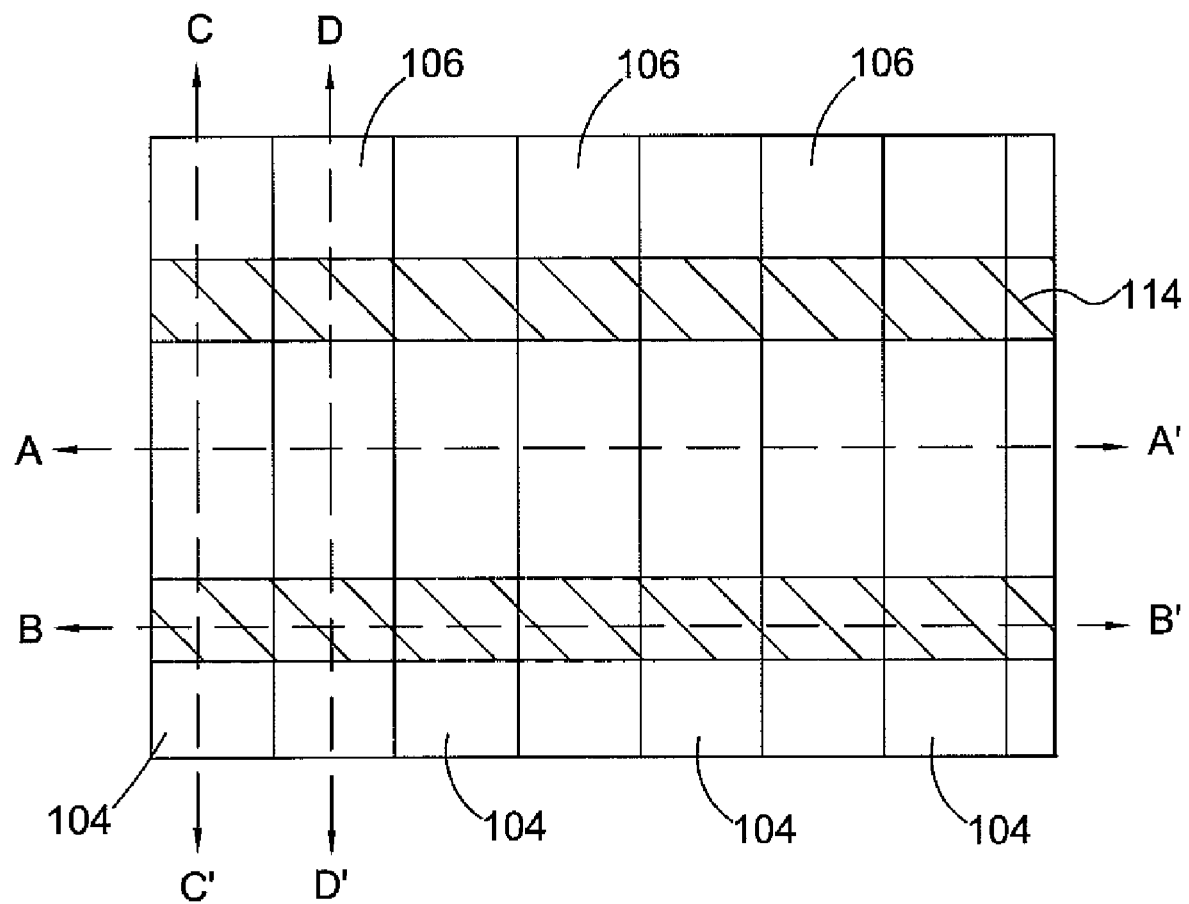
FIGS. 4, 4A, 4B, 4C and 4D are a top view and cross-sectional views taken along lines A-A', B-B', C-C' and D-D' of FIG. 4, respectively, showing the step of reducing the patterned mask layer in the method of forming a semiconductor device according to one embodiment of the present invention.
Figure 4A:
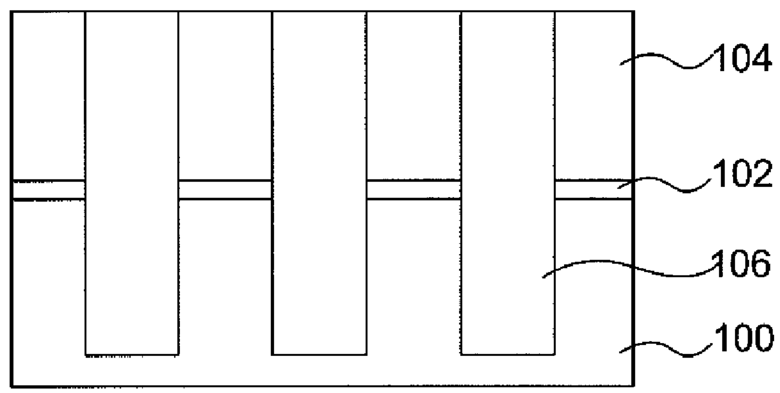
Figure 4B:
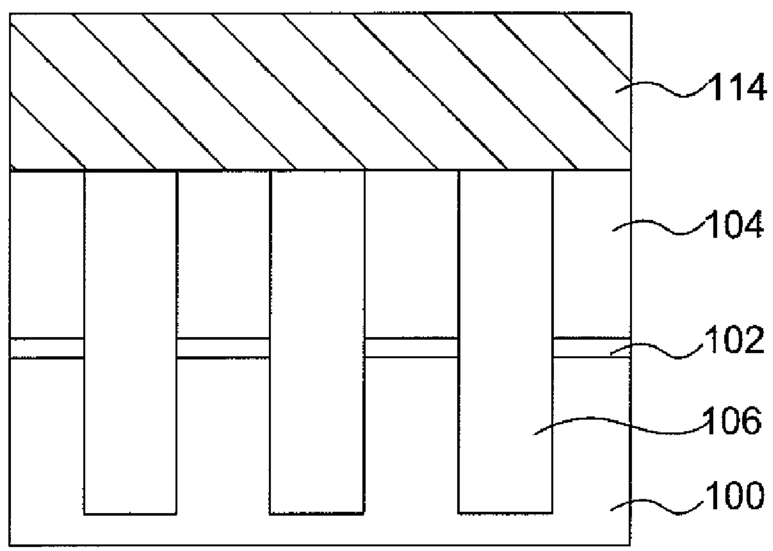
Figure 4C:
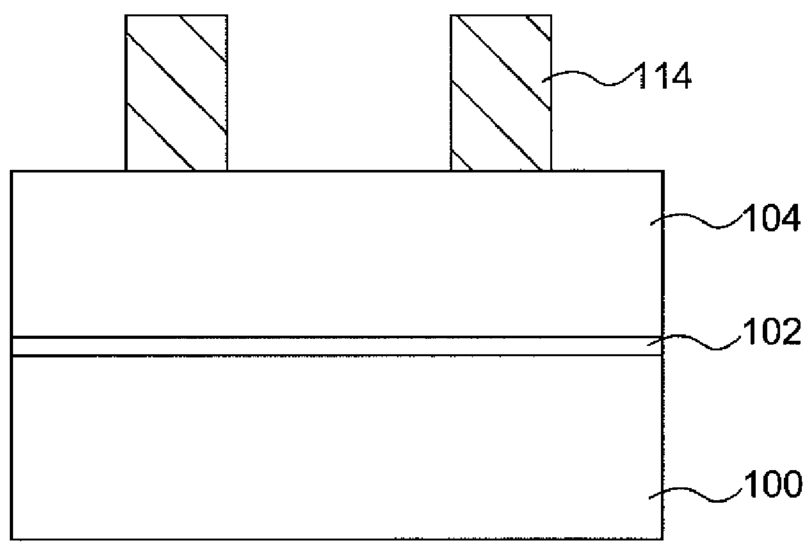
Figure 4D:
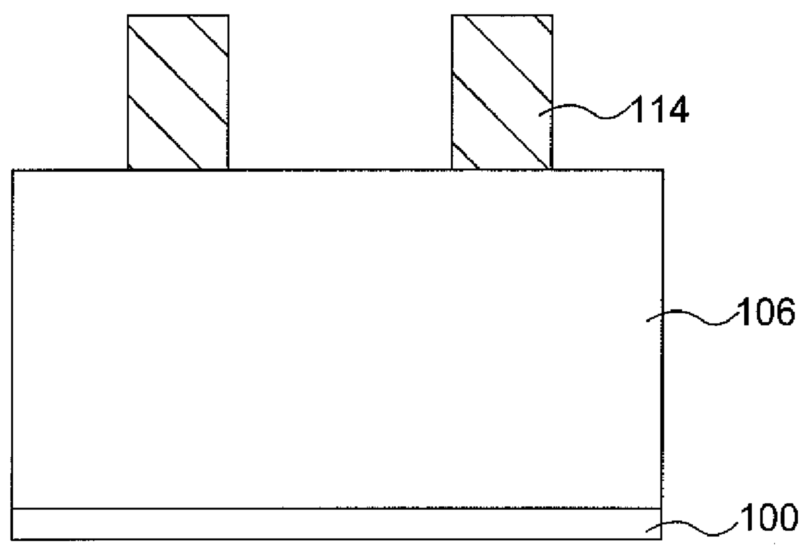

FIGS. 4, 4A, 4B, 4C and 4D are top and cross-sectional views taken along lines A-A', B-B', C-C' and D-D' of FIG. 4, respectively, showing the step of reducing the patterned mask layer 112 (as shown in FIG. 3C) in the method of forming a semiconductor device according to one embodiment of the present invention. As shown in the figures, a portion of the patterned mask layer 112 is laterally removed and the retained portion of the patterned mask layer 112 is defined as a reduced mask layer 114. In this embodiment, the step of laterally removing the patterned mask layer 112 is preferably performed by an etching back process, such as a dry etching process or a wet etching process, such that a width of the reduced mask layer 114 is smaller than the width of the patterned mask layer 112 defined by the patterned photoresist 110.

Figure 5:
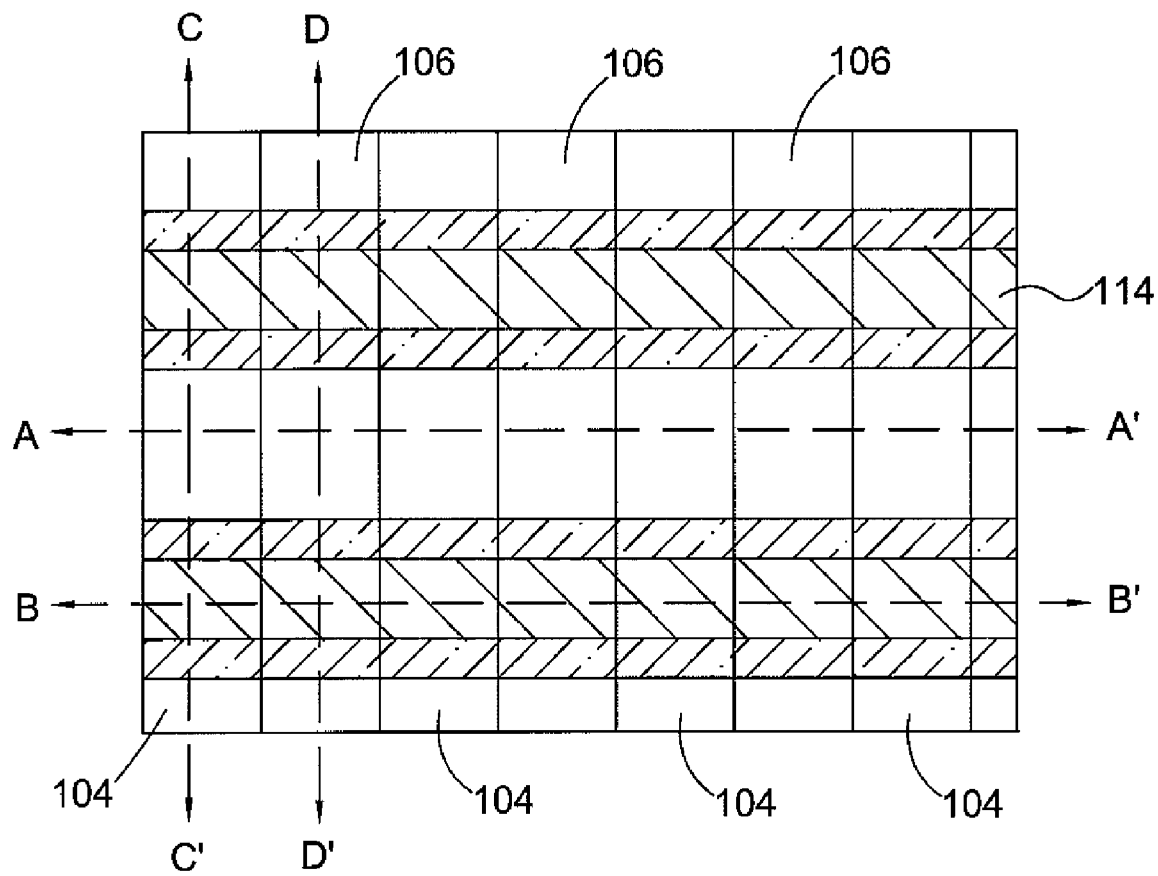
FIGS. 5, 5A, 5B, 5C and 5D are a top view and cross-sectional views taken along lines A-A', B-B', C-C' and D-D' of FIG. 5, respectively, showing the step of forming a spacer in the method of forming a semiconductor device according to one embodiment of the present invention.
Figure 5A:
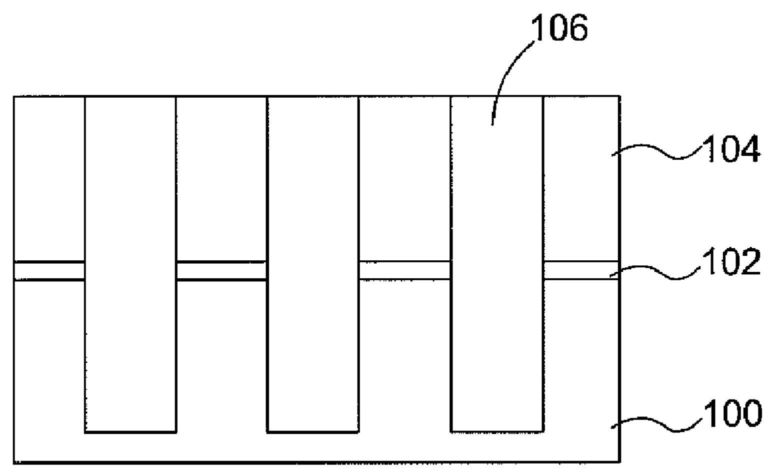
Figure 5B:
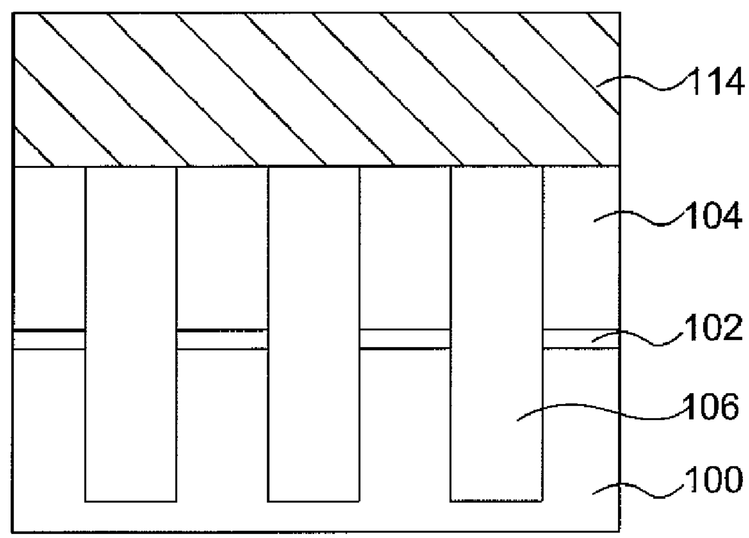
Figure 5C:
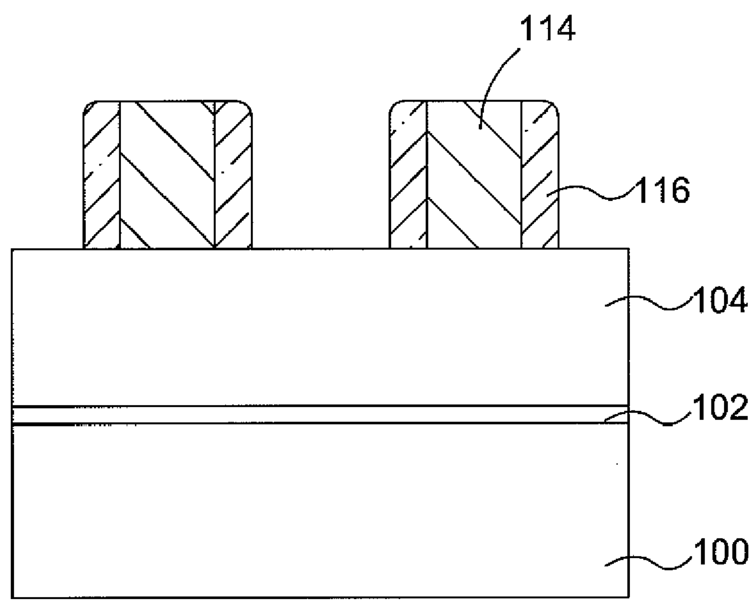
Figure 5D:
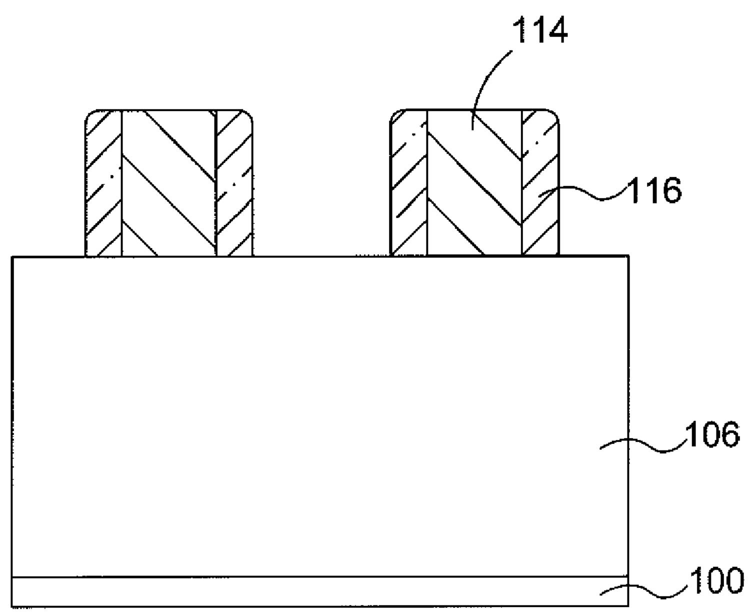

FIGS. 5, 5A, 5B, 5C and 5D are top and cross-sectional views taken along lines A-A', B-B', C-C' and D-D' of FIG. 5, respectively, showing the step of forming a spacer 116 in the method of forming a semiconductor device according to one embodiment of the present invention. As shown in the figures, a spacer 116 is formed on the sidewall of the reduced mask layer 114. The step of forming the spacer 116 includes conformally depositing a dielectric layer (such as an oxide layer) on the entire structure covering the reduced mask layer 114, and then anisotropically etching the dielectric layer. In the anisotropically etching step, the dielectric layer on the reduced mask layer 114 and the first conductive layer 104 are selectively removed, and the dielectric layer on sidewalls of the reduced mask layer 114 is retained, so that the spacer 116 formed on sidewalls of the reduced mask layer 114 is obtained. It is noted that the materials of the spacer 116 and the reduced mask layer 114 may be changed depending on the design needs. Preferably, the spacer 116 and the reduced mask layer 114 respectively have a suitable etching selectivity for the subsequent processes.

Figure 6:
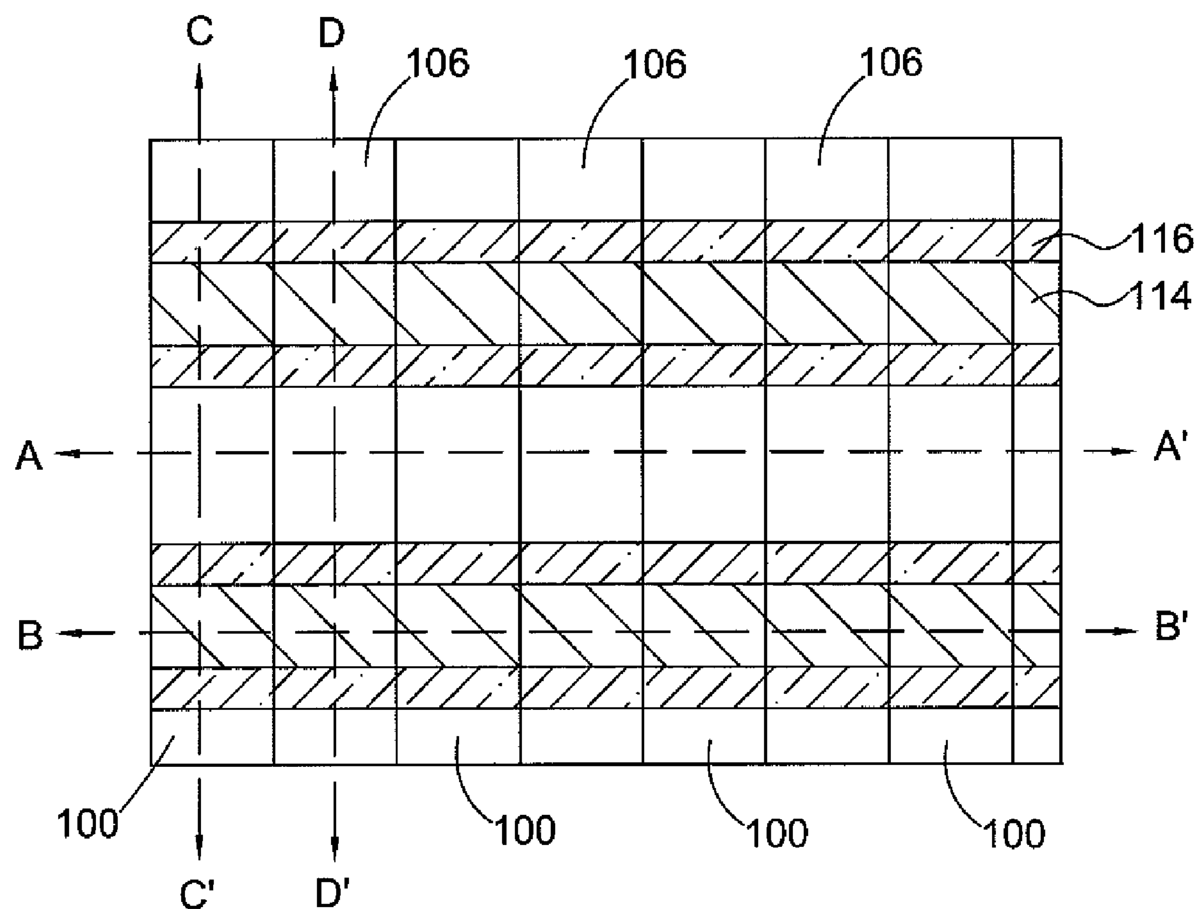
FIGS. 6, 6A, 6B, 6C and 6D are a top view and cross-sectional views taken along lines A-A', B-B', C-C' and D-D' of FIG. 6, respectively, showing the step of removing a portion of the first conductor layer in the method of forming a semiconductor device according to one embodiment of the present invention.
Figure 6A:
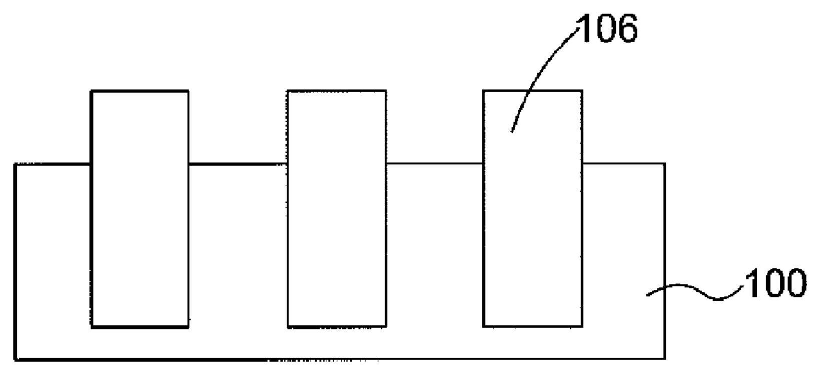
Figure 6B:
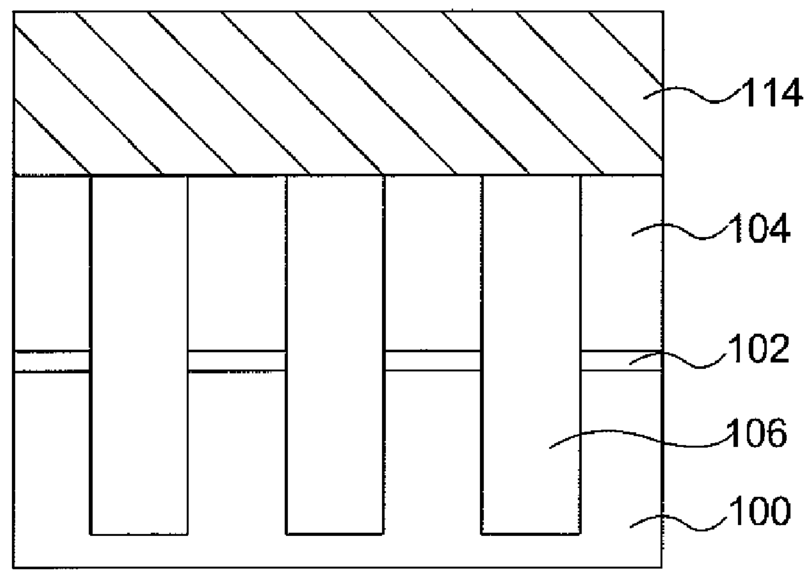
Figure 6C:
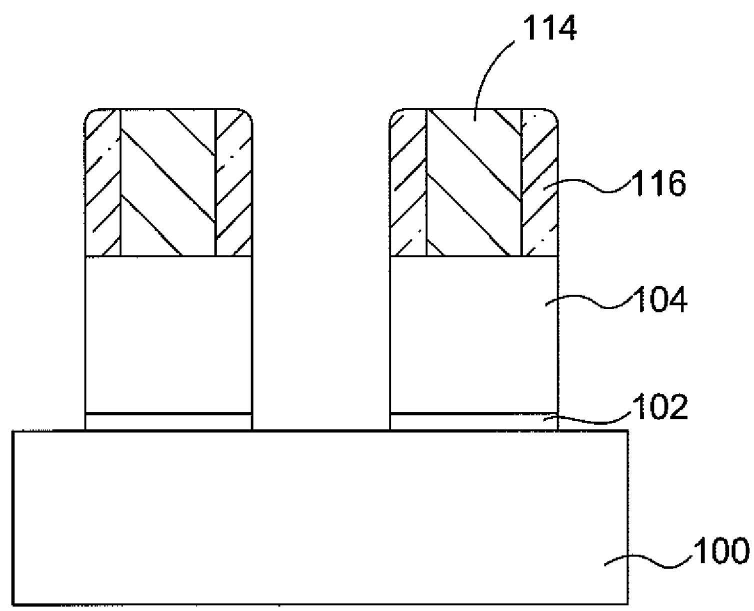
Figure 6D:
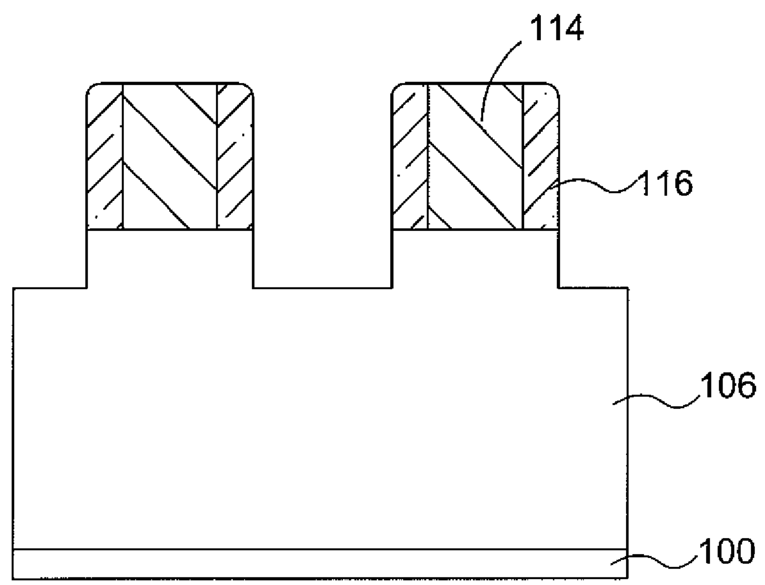

FIGS. 6, 6A, 6B, 6C and 6D are top and cross-sectional views taken along lines A-A', B-B', C-C' and D-D' of FIG. 6, respectively, showing the step of removing a portion of the first conductive layer 104 in the method of forming a semiconductor device according to one embodiment of the present invention. As shown in the figures, the first conductive layer 104 and the first dielectric layer 102 are etched to expose a portion of the substrate 100 by using the spacer 116 and the reduced mask layer 114 as a mask, so that a patterned stack structure as shown in FIG. 6C is formed. Moreover, the dielectric isolations 106 may be etched back to remove a portion of the dielectric isolations 106, so that a top surface of each of the dielectric isolations 106 is lowered but still higher than a top surface of the exposed substrate 100, as shown in FIG. 6A.

Figure 7:
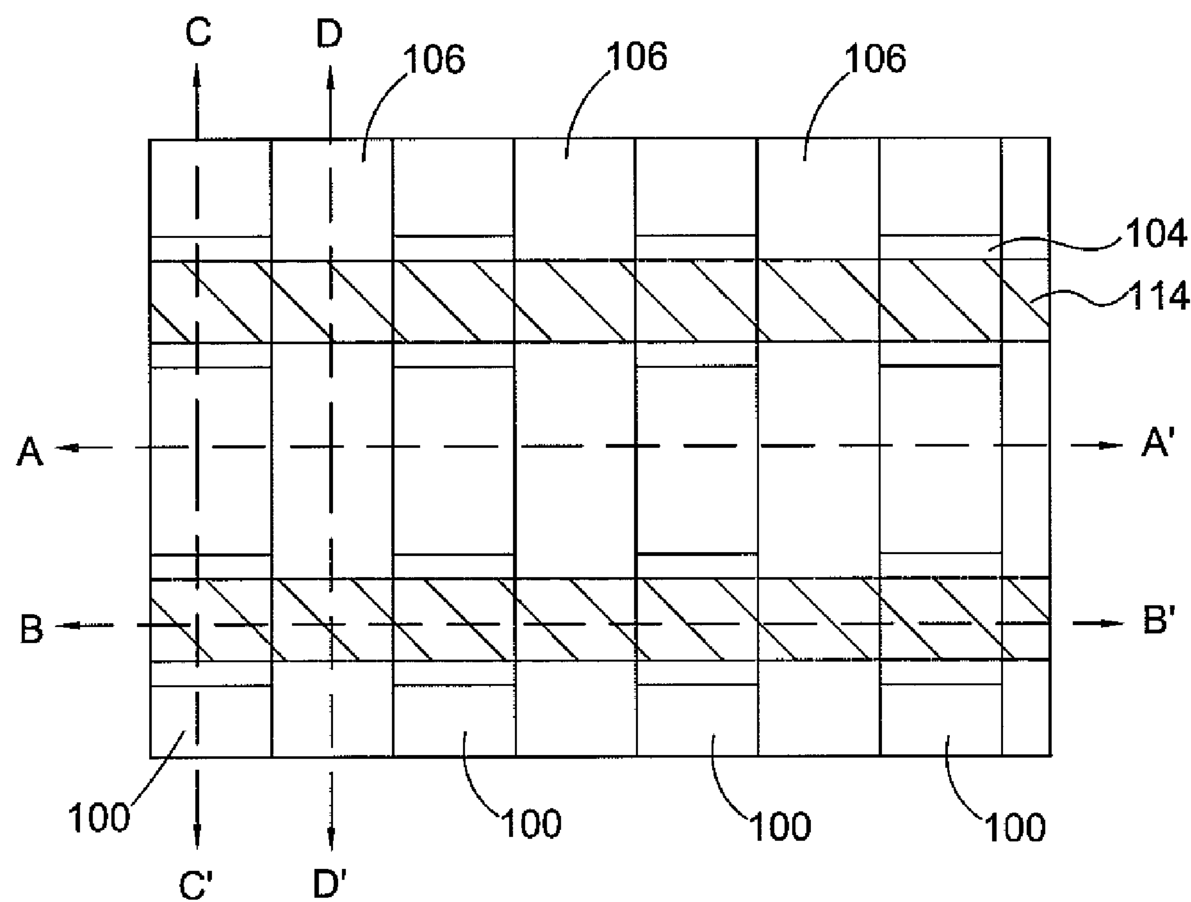
FIGS. 7, 7A, 7B, 7C and 7D are a top view and cross-sectional views taken along lines A-A', B-B', C-C' and D-D' of FIG. 7, respectively, showing the step of removing the spacer in the method of forming a semiconductor device according to one embodiment of the present invention.
Figure 7A:
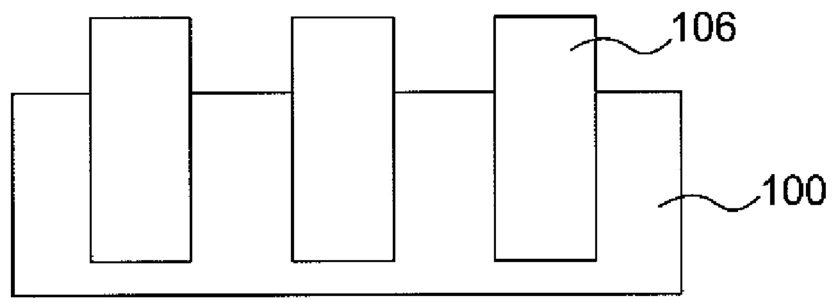
Figure 7B:
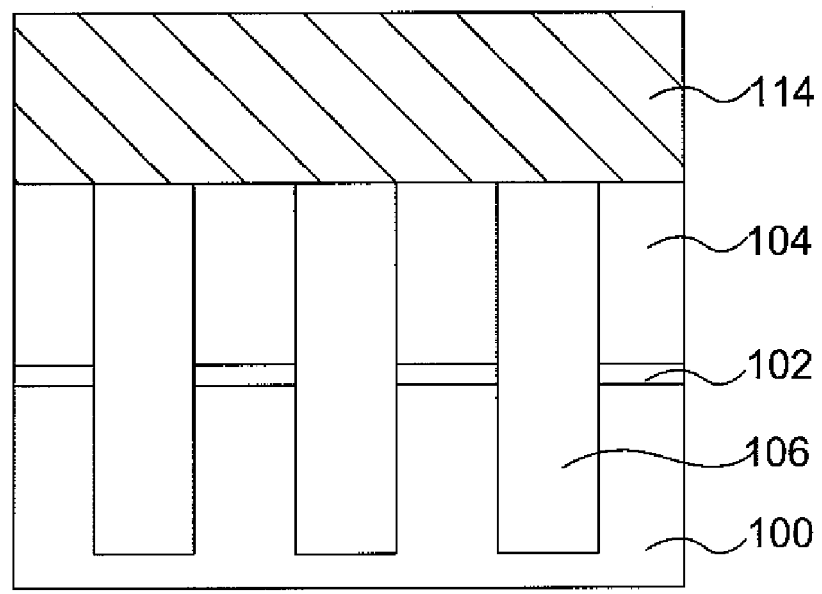
Figure 7C:
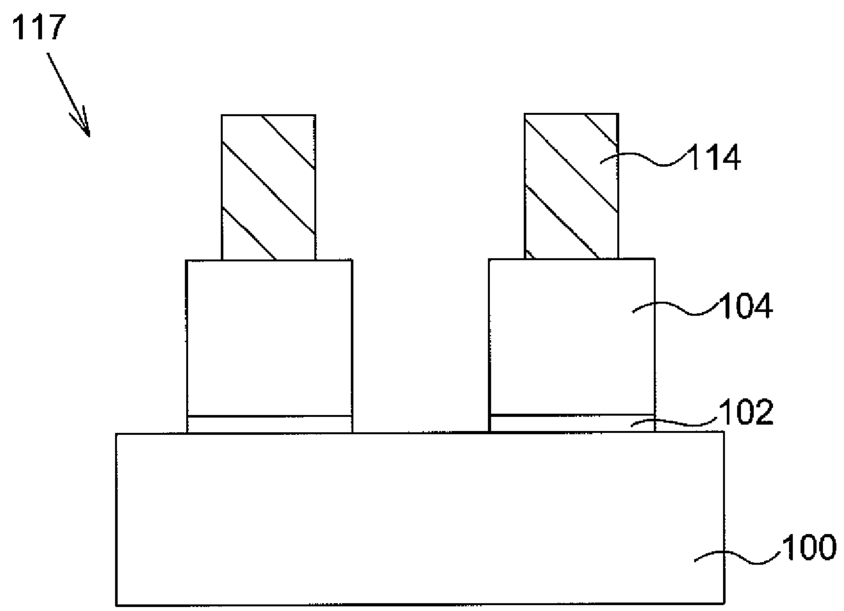
Figure 7D:
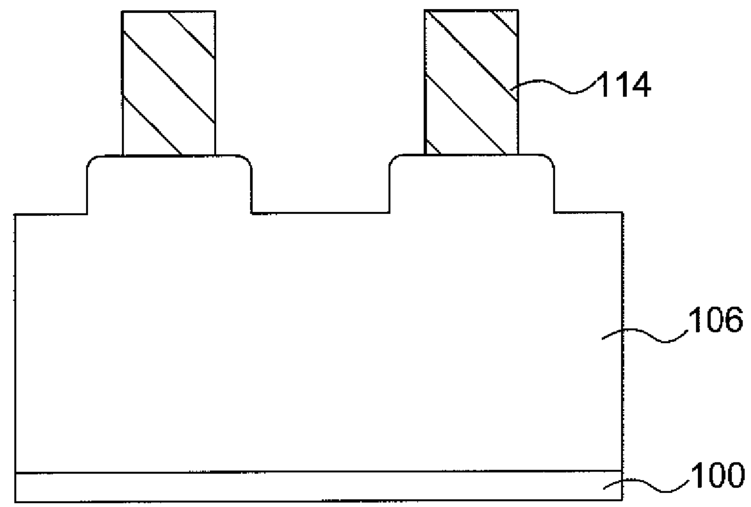

FIGS. 7, 7A, 7B, 7C and 7D are top and cross-sectional views taken along lines A-A', B-B', C-C' and D-D' of FIG. 7, respectively, showing the step of removing the spacer 116 in the method of forming a semiconductor device according to one embodiment of the present invention. As shown in the figures, the spacer 116 is removed to expose a portion of the first conductive layer 104 covered by the spacer 116 by using any suitable etching techniques as shown in FIG. 7C. It is noted that since the first conductive layer 104 is protected by the spacer 116, both the reduced mask layer 114 and the first conductive layer 104 have a substantially vertical sidewall after the above etching step. Therefore, the edge damage of the gate conductor that would occur in conventional manufacturing processes for patterning the gate conductor can be improved. The width of the first conductor 104 can be adjusted depending on the design needs. In general, it may be adjusted depending on the etching-back thickness of the reduced mask layer 114, for example, but not limited to, the etching-back thickness of the reduced mask layer 114 is about 200 Å, and the width of the spacer 116 relatively is about 200 Å. Alternatively, by adjusting the thickness (or the height) of the dielectric layer deposited for the spacer 116, the width of the spacer 116 may be effectively adjusted to define the width of the first conductive layer 104 functioning as the floating gate of the memory device. At this stage, a patterned stack 117 is formed on the substrate 100. The patterned stack 117 includes the first dielectric layer 102, the first conductive layer 104, and the reduced mask layer 114, wherein a width of the reduced mask layer 114 is smaller than a width of the first conductive layer 104 (and the first dielectric layer 102), as shown in FIG. 7C.

Figure 8:
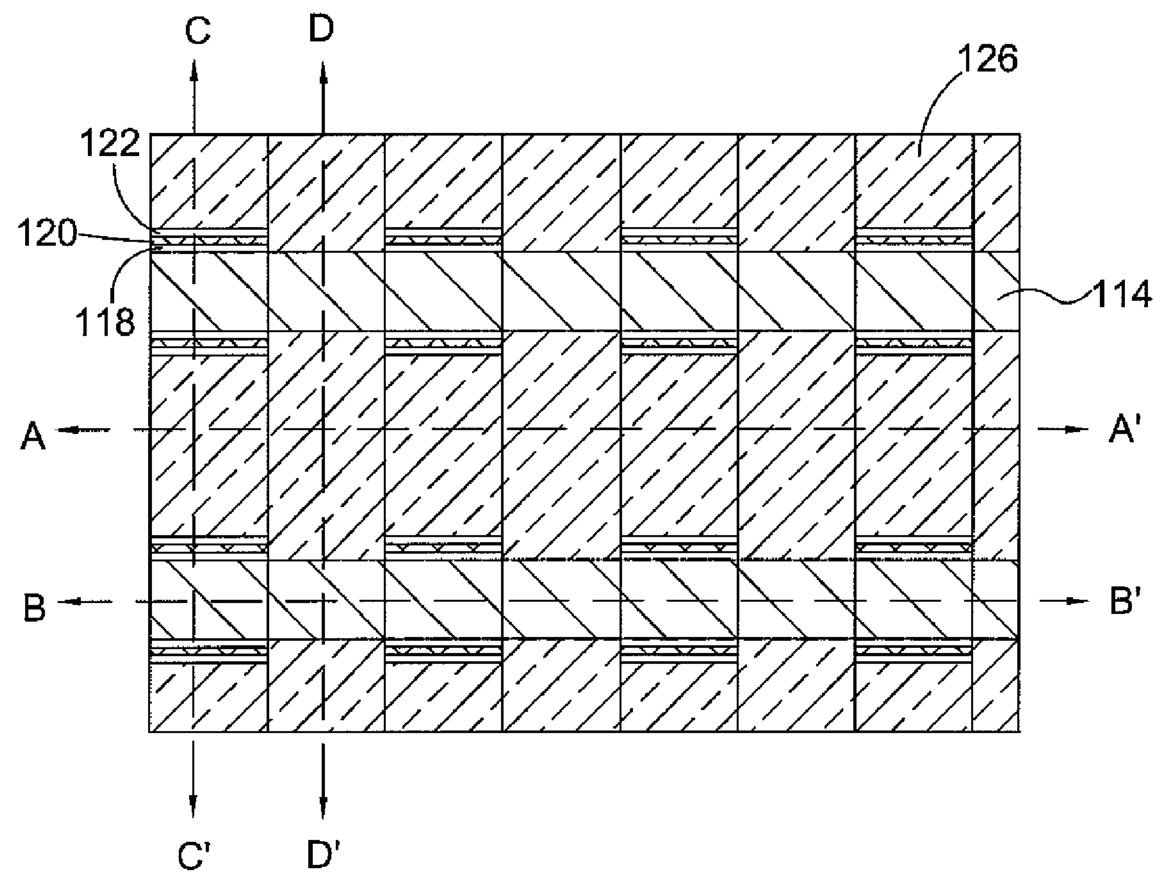
FIGS. 8, 8A, 8B, 8C and 8D are a top view and cross-sectional views taken along lines A-A', B-B', C-C' and D-D' of FIG. 8, respectively, showing the step of forming a control gate conductor in the method of forming a semiconductor device according to one embodiment of the present invention.
Figure 8A:
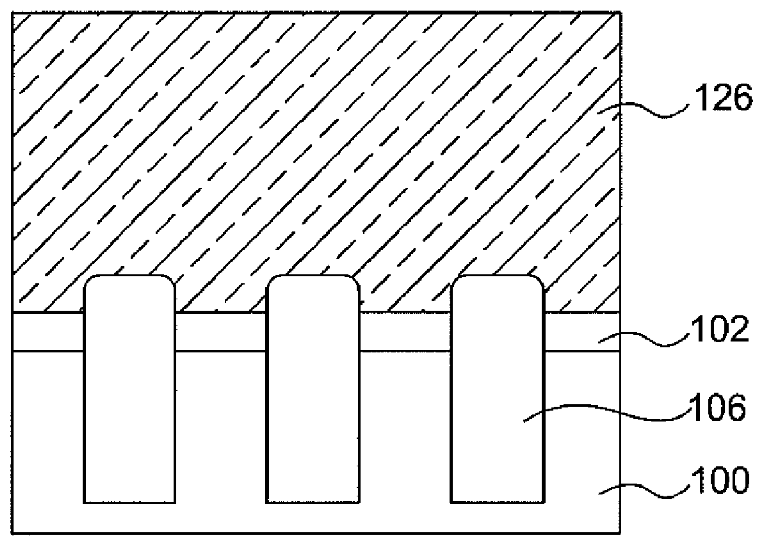
Figure 8B:
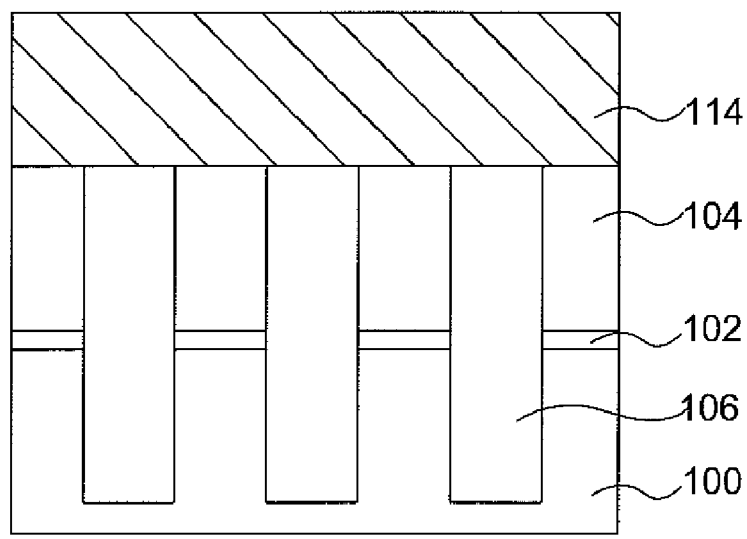
Figure 8C:
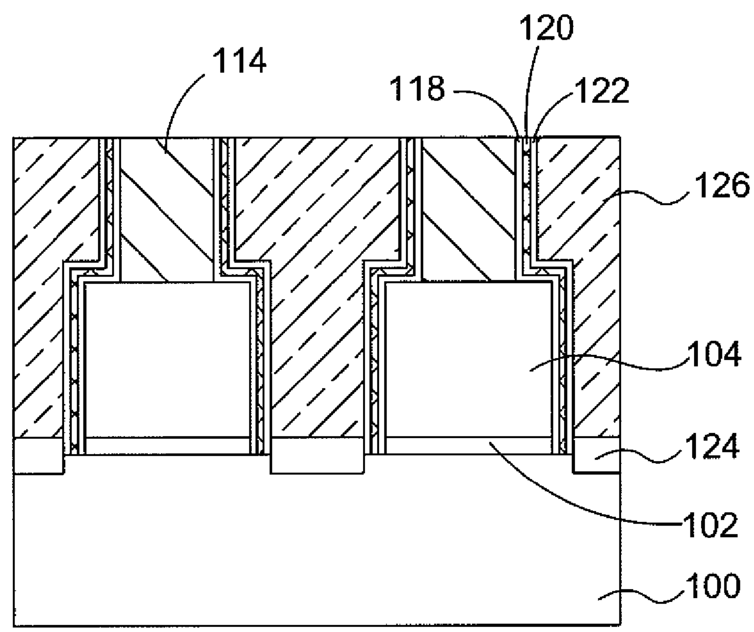
Figure 8D:
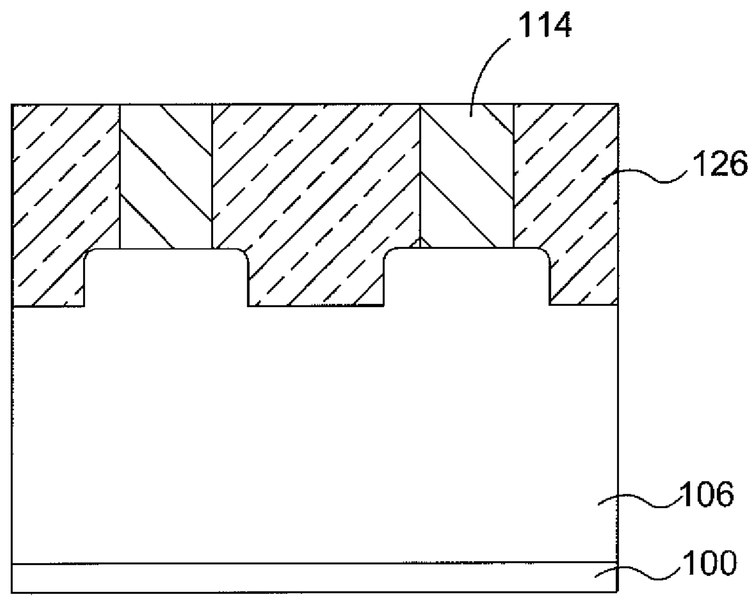

FIGS. 8, 8A, 8B, 8C and 8D are top and cross-sectional views taken along lines A-A', B-B', C-C' and D-D' of FIG. 8, respectively, showing the step of forming a control gate conductor in the method of forming a semiconductor device according to one embodiment of the present invention. As shown in the figures, after the step of removing the spacer 116, the second dielectric layer is formed on sidewalls of the patterned stack 117 as a coupling dielectric layer between the first conductive layer 104 (e.g. a floating gate) and a second conductive layer 126 (e.g. a control gate) later to be formed. The second dielectric layer can be a dielectric layer having a single layer or multi-layer structure. For example, in this embodiment, the step of forming the second dielectric layer includes forming a three-layer structure, such as an oxide-nitride-oxide (ONO) structure. In an exemplary embodiment, a first oxide layer 118 is conformally deposited on the substrate 100 and the patterned stack 117 (i.e. on sidewalls and the top of the reduced mask layer 114 and the first conductive layer 104, and the sidewalls of the first dielectric layer 102). Then, a nitride layer 120 is conformally formed on the first oxide layer 118, and a second oxide layer 122 is subsequently formed on the nitride layer 120, so that a conformal dielectric layer having an oxide-nitride-oxide (ONO) structure is obtained. Then, the conformal dielectric layer on the substrate 100 is removed to expose a portion of the substrate 100, and the conformal dielectric layer on the patterned stack 117 (i.e. on the sidewall and the top of the reduced mask layer 114 and the first conductive layer 104, and the sidewalls of the first dielectric layer 102) is remained serving as a dielectric layer between a floating gate and a control gate of the memory device. Furthermore, a third dielectric layer 124 is formed on the exposed portion of the substrate 100. Preferably, thermally the exposed portion of the substrate 100 where the conformal dielectric layer is removed is oxidized to form an oxide layer functioning as a gate dielectric layer of a memory device. Next, a second conductive layer 126 is formed on the second dielectric layer and the third dielectric layer 124. For example, a conductive layer is blanket-deposited over the conformal dielectric layer (e.g. an ONO structure), so that the second conductive layer 126 is over the substrate 100. Then, the second conductive layer 126 is planarized to expose the reduced mask layer 114, and preferably, is planarized by using chemical mechanical polishing. Moreover, the second conductive layer 126 fills the spaces between the patterned stacks 117, as shown in FIG. 8. In this embodiment, the second conductive layer 126 may be a doped or an undoped polysilicon layer for a control gate conductor of a memory device.

Figure 9:
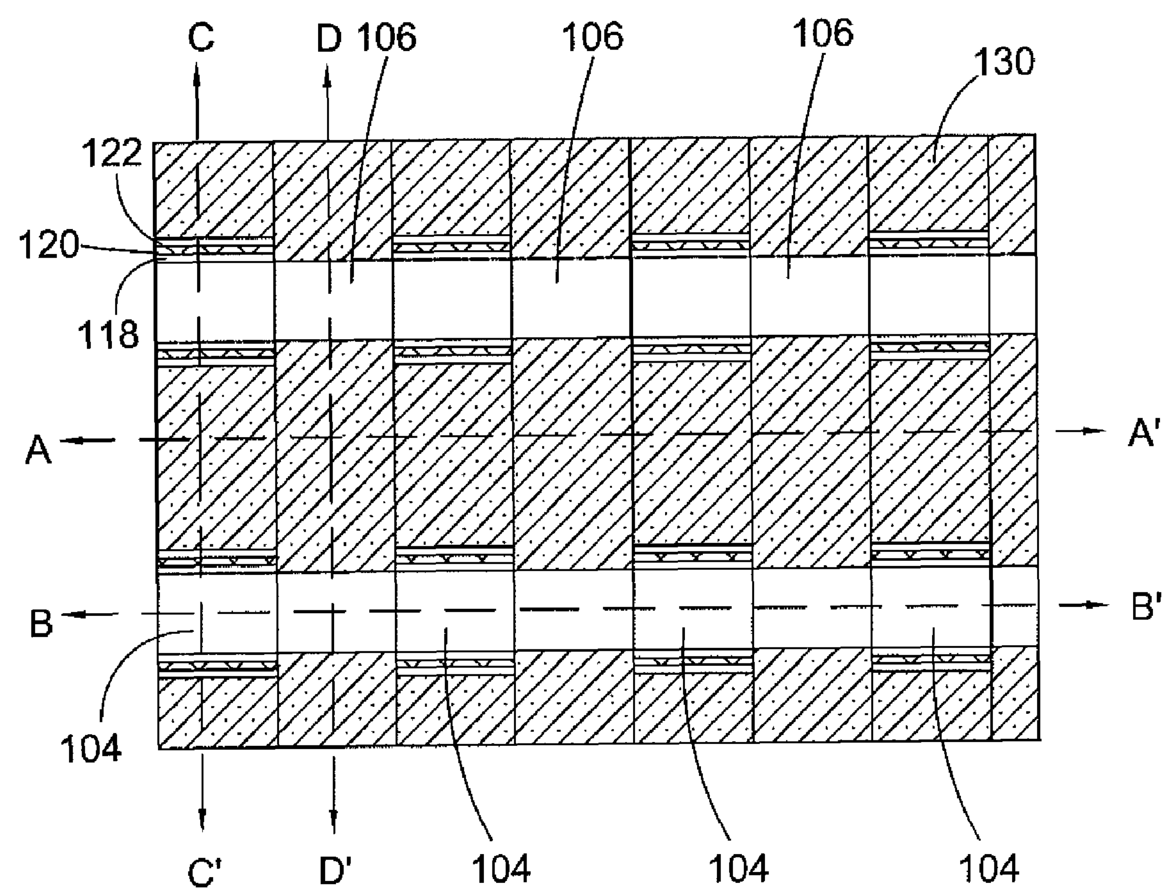
FIGS. 9, 9A, 9B, 9C and 9D are a top view and cross-sectional views taken along lines A-A', B-B', C-C' and D-D' of FIG. 9, respectively, showing the step of removing the reduced mask layer in the method of forming a semiconductor device according to one embodiment of the present invention.
Figure 9A:
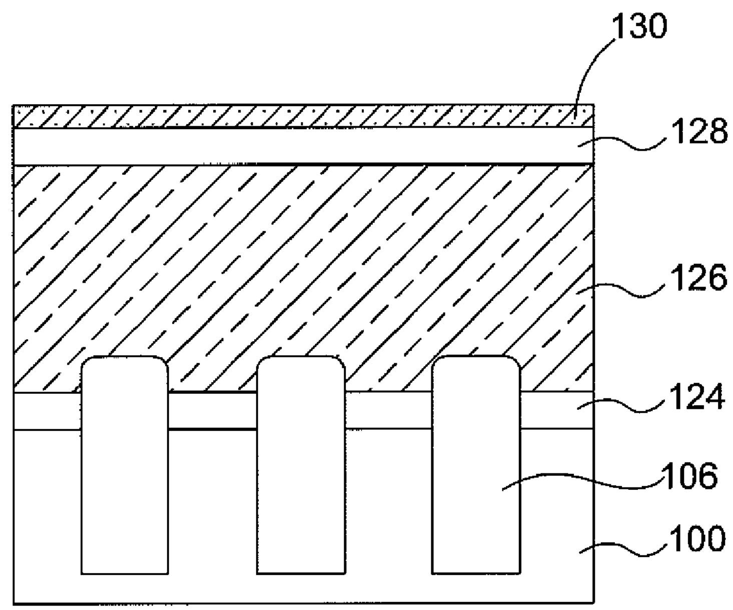
Figure 9B:
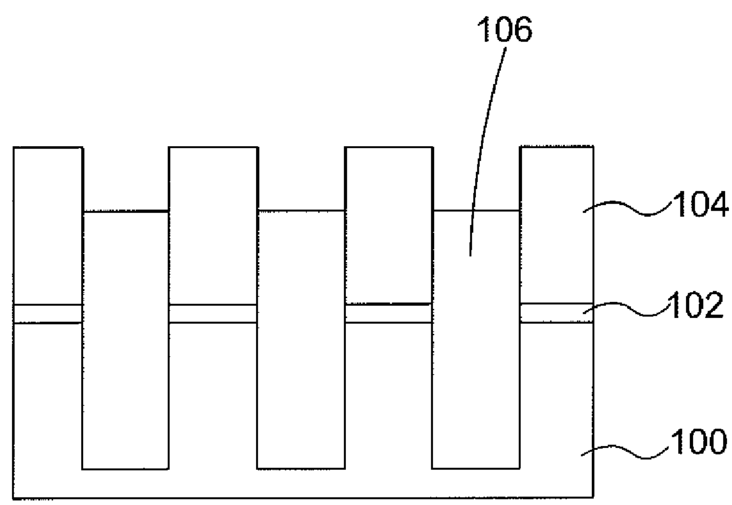
Figure 9C:
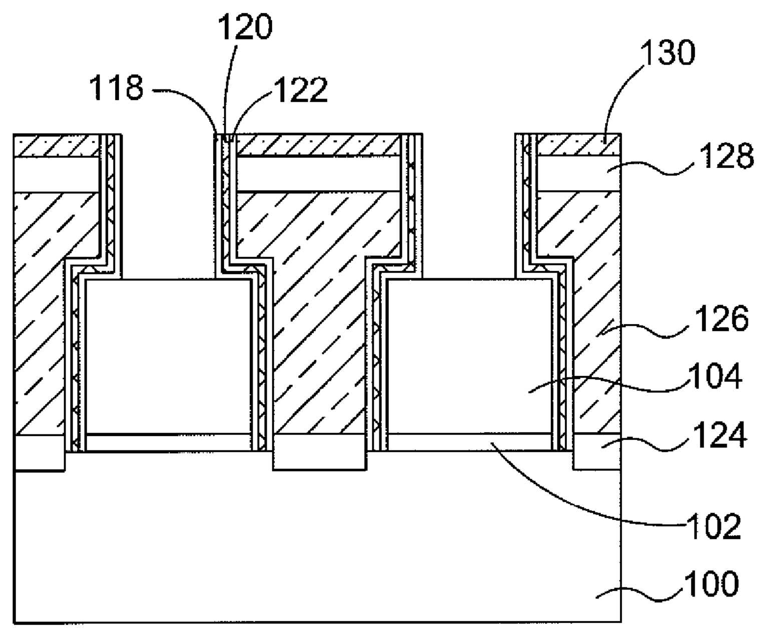
Figure 9D:
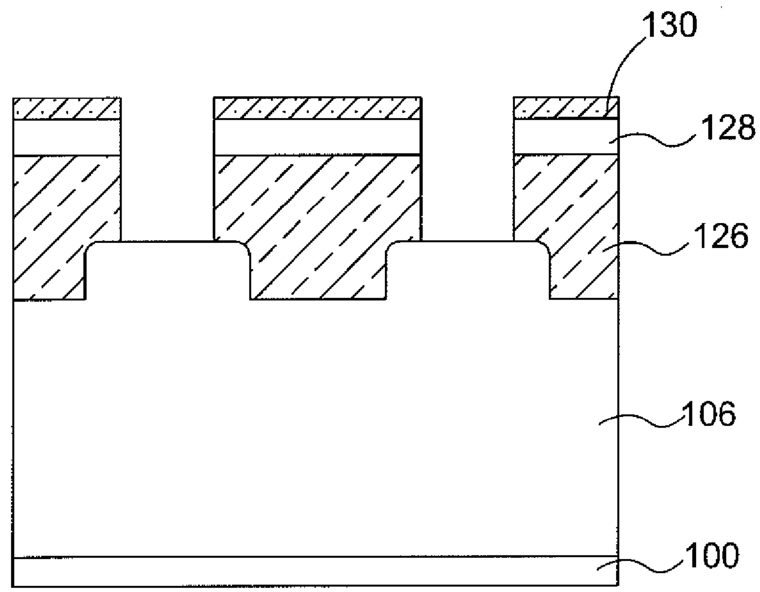

FIGS. 9, 9A, 9B, 9C and 9D are top and cross-sectional views taken along lines A-A', B-B', C-C' and D-D' of FIG. 9, respectively, showing the step of removing the reduced mask layer 114 in the method of forming a semiconductor device according to one embodiment of the present invention. As shown in the figures, a portion of the second conductive layer 126 is selectively etched back, so that the surface of the second conductive layer 126 is lower than the surface of the reduced mask layer 114 and higher than the surface of the first conductive layer 104. Then, a protective layer is formed on the second conductive layer 126. The protective layer is formed for providing a protective mask on the second conductive layer 126 to protect the first conductive layer 104 from being damaged in the subsequently etching process when the etching selectivity difference between the first conductive layer 104 and the second conductive layer 126 is small. In an exemplary embodiment, the protective layer can be a single layer or multi-layer structure. For example, the step of forming the protective layer includes forming a mask oxide layer 128 on the second conductive layer 126, forming a mask conductive layer 130 on the mask oxide layer 128, and then planarizing the mask conductive layer 130 until the mask conductive layer 130 and the reduced mask layer 114 are substantial coplanar. In this embodiment, the mask conductive layer 130 includes a polysilicon layer. Subsequently, the reduced mask layer 114 is removed to expose a portion of the first conductive layer 104 by using the protective layer (including the mask conductive layer 130 and the mask oxide layer 128) as a mask. Furthermore, by using the exposed portion of the first conductive layer 104 and the mask conductive layer 130 as a mask, the dielectric isolations 106 are partially etched back. Preferably, a surface of the dielectric isolations 106 is lower than that of the first conductive layer 104 and higher than that of the first dielectric layer 102, as shown in FIG. 9B.

Figure 10:
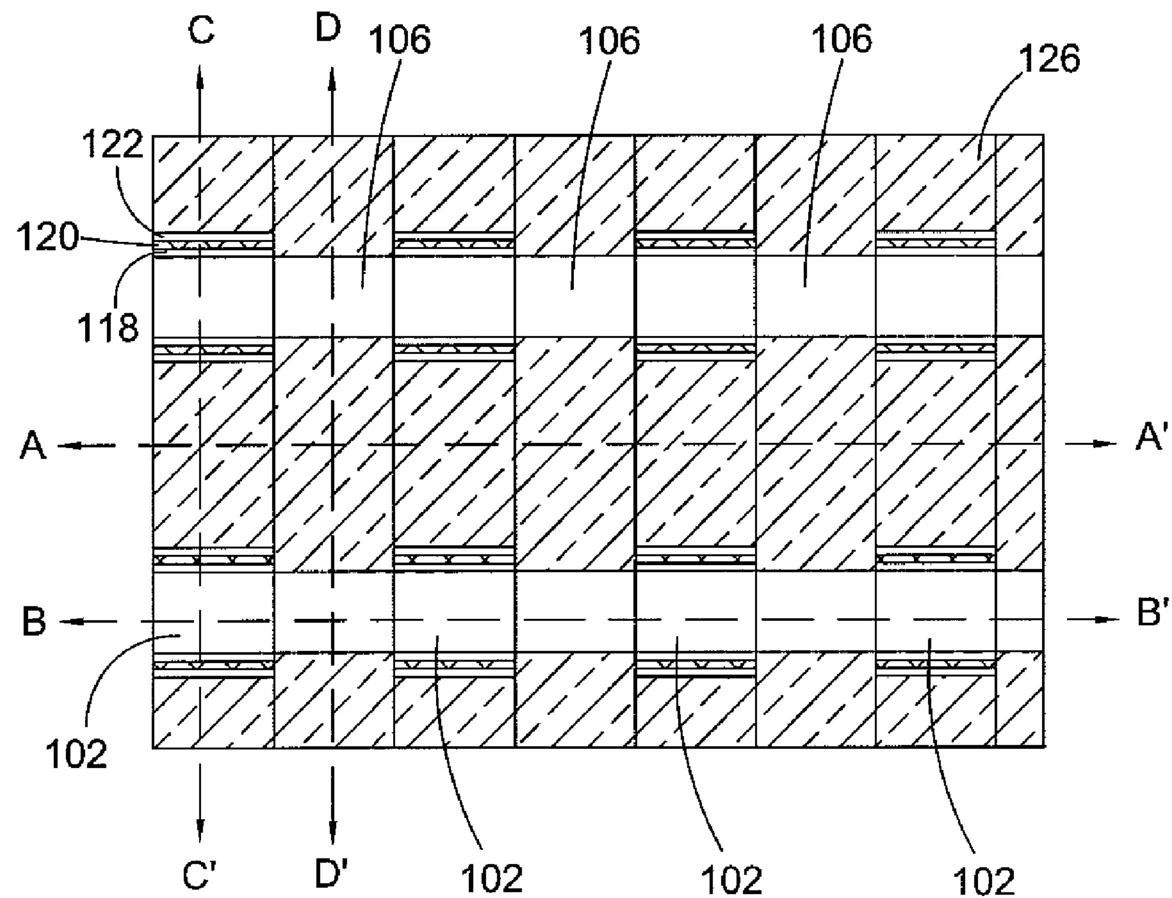
FIGS. 10, 10A, 10B, 10C and 10D are a top view and cross-sectional views taken along lines A-A', B-B', C-C' and D-D' of FIG. 10, respectively, showing the step of defining a floating gate in the method of forming a semiconductor device according to one embodiment of the present invention.
Figure 10A:
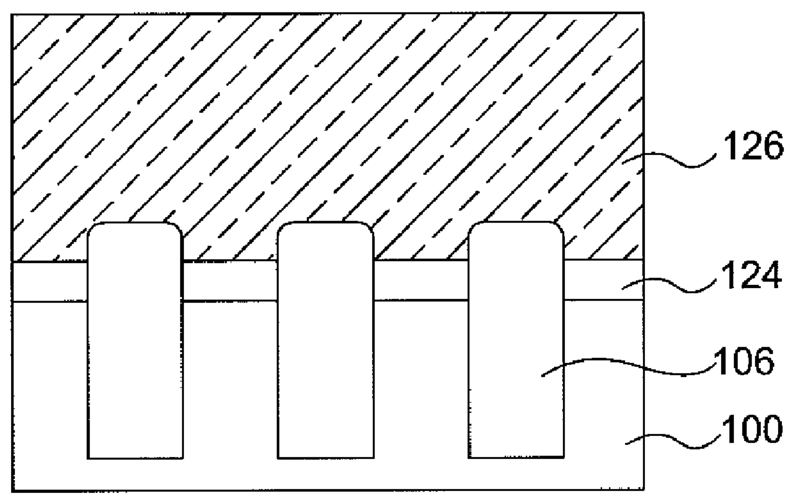
Figure 10B:
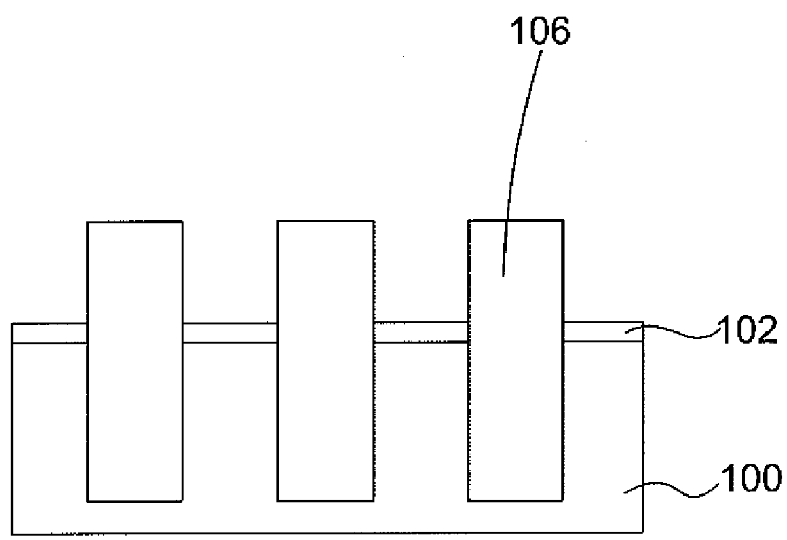
Figure 10C:
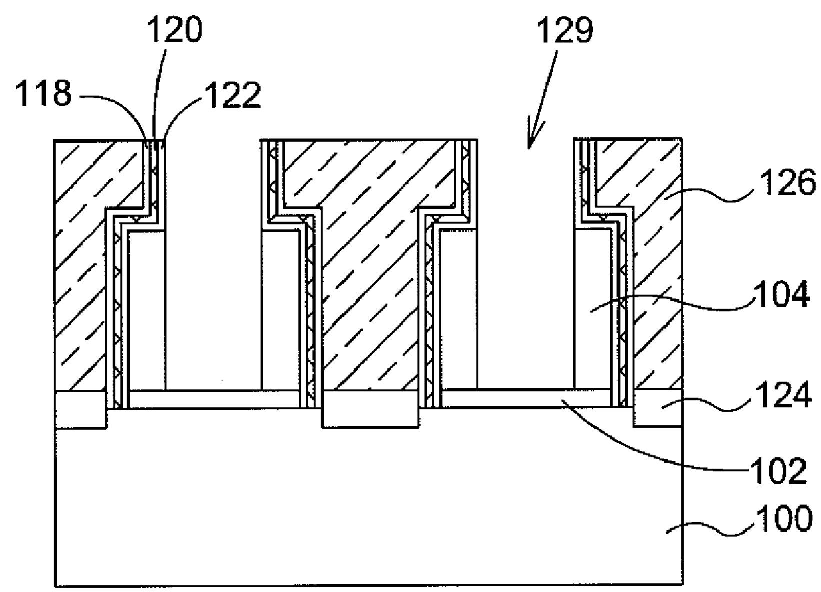
Figure 10D:
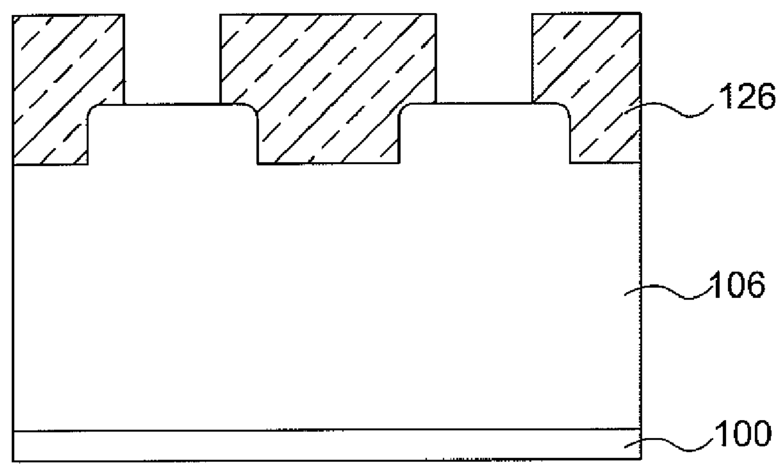

FIGS. 10, 10A, 10B, 10C and 10D are top and cross-sectional views taken along lines A-A', B-B', C-C' and D-D' of FIG. 10, respectively, showing the step of defining a floating gate in the method of forming a semiconductor device according to one embodiment of the present invention. As shown in the figures, the exposed portion of the first conductive layer 104 (i.e. the first conductive layer 104 coved by the reduced mask layer 114 removed in the previous steps) is removed by using the protective layer (such as the mask oxide layer 128) as a mask to form an opening 129 exposing a remaining portion of the first conductive layer 104, as shown in FIG. 10C. In the steps of removing the reduced mask layer 114 and the first conductive layer 104 covered by the reduced mask layer 114, the patterned stack 117 having a reversed T-shape structure is protected by the protective layer (such as the mask oxide layer 128), so that the remaining portion of the first conductive layer 104 and the second conductive layer 126 is substantially contacted at a right angle with the second dielectric layer there between (e.g. the oxide-nitride-oxide layers 118, 120 and 122). Thus, the edge rounding issue of the floating gate can be improved. Next, the protective layer on the second conductive layer 126 is removed. Note that when the first conductive layer 104 is etched, the mask conductive layer 130 may be simultaneously removed or removed separately depending on the thickness of the layers. Furthermore, the second dielectric layer (the ONO structure) adjacent to the sidewall of the protective layer may be removed to planarize the structure.

Figure 11:
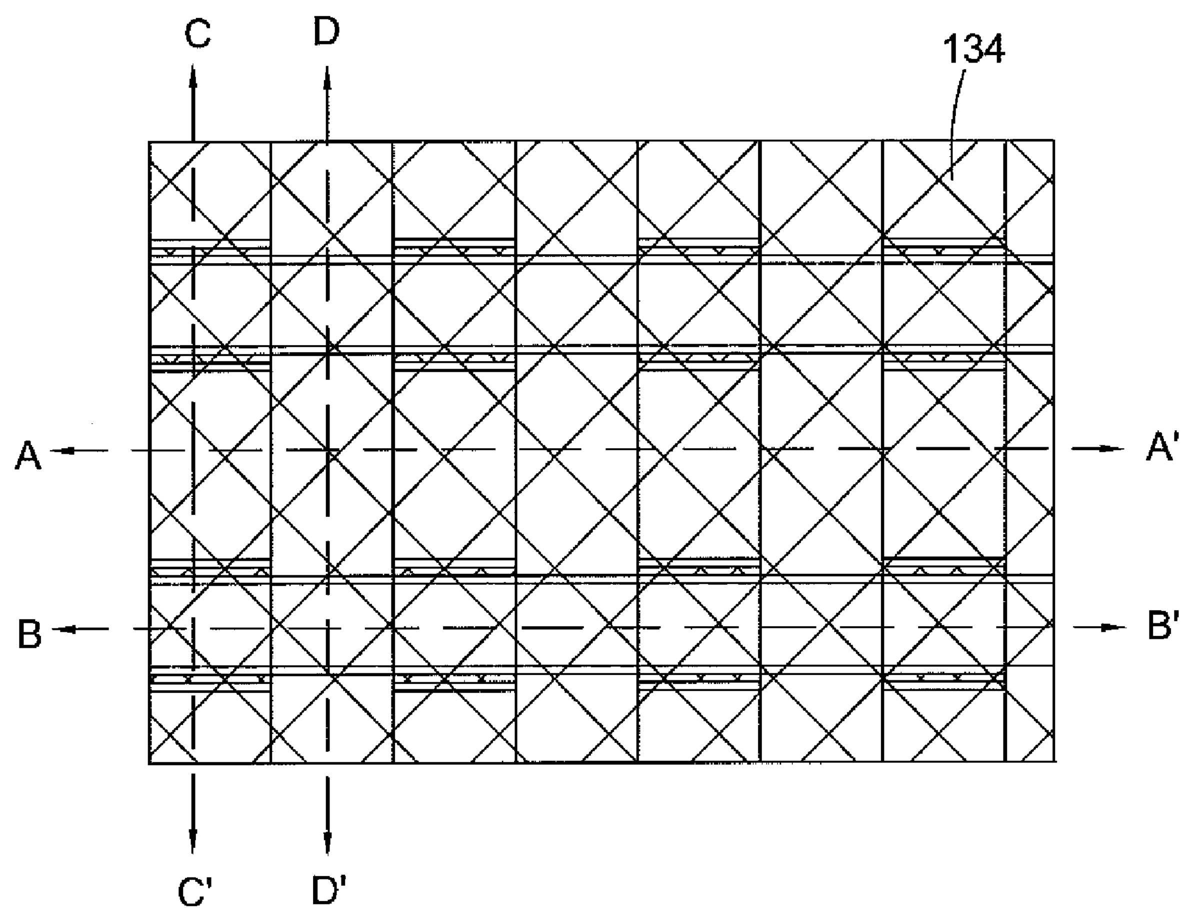
Figure 11A:
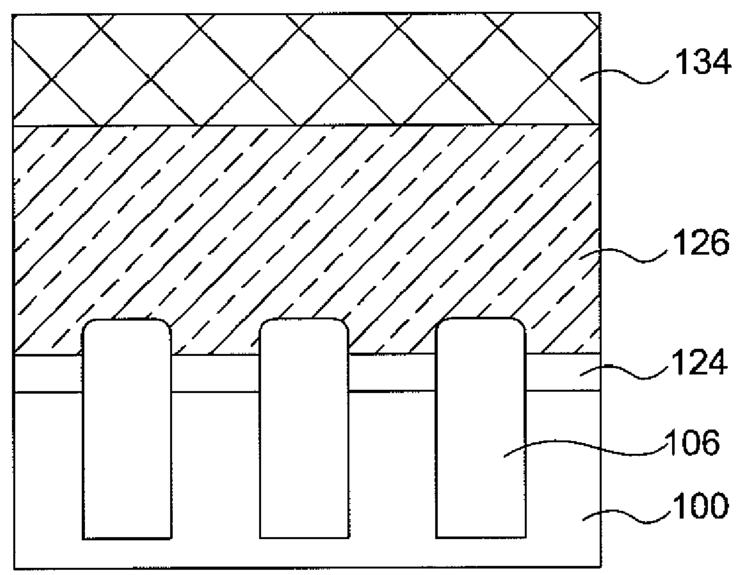
Figure 11B:
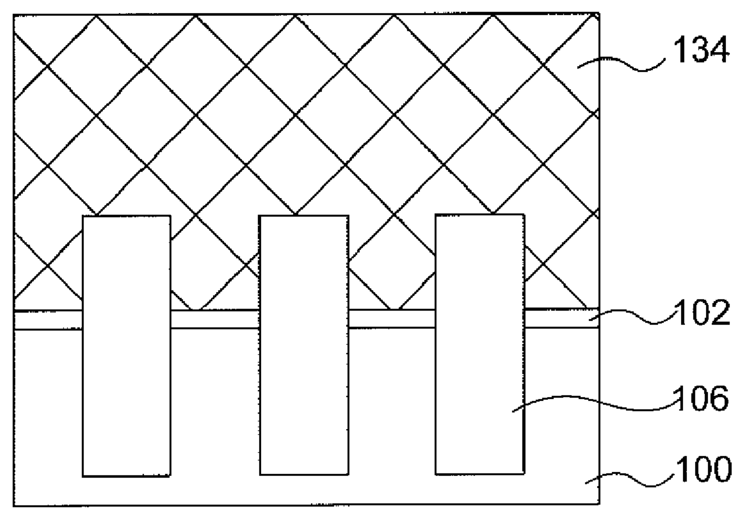
Figure 11C:
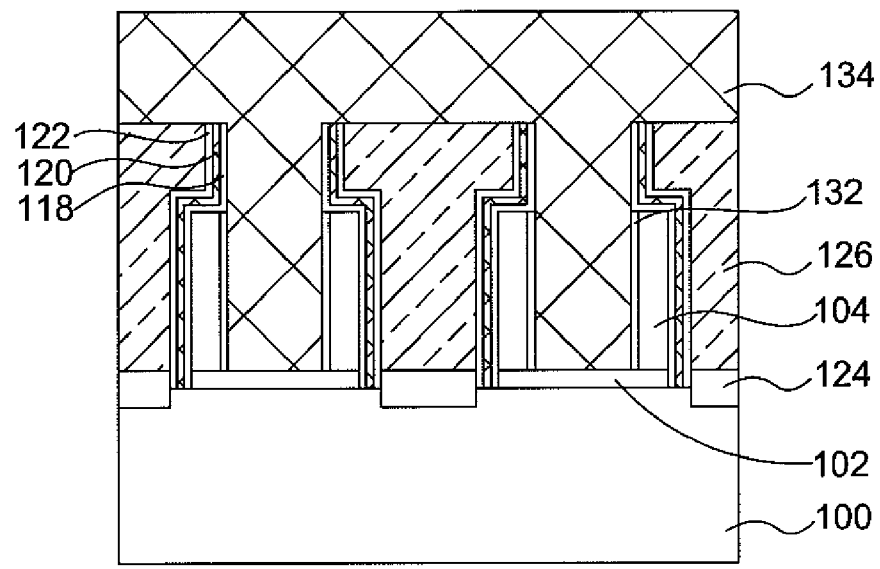
Figure 11D:
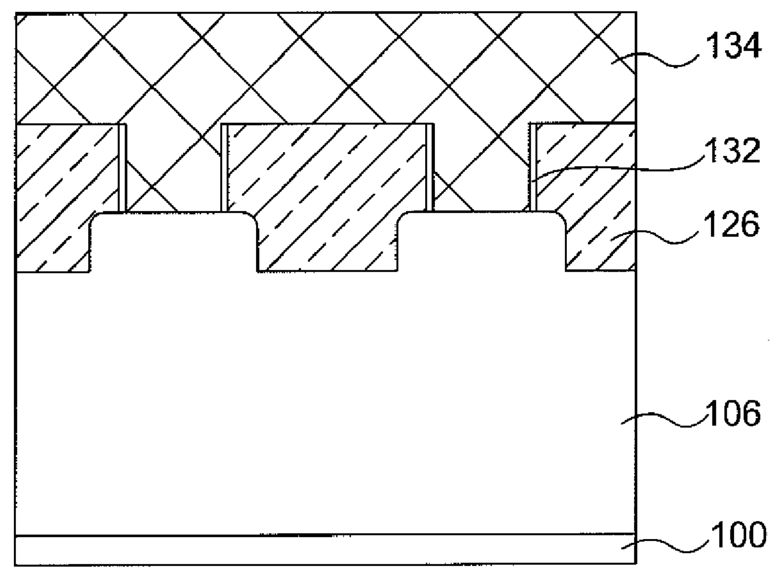

FIGS. 11, 11A, 11B, 11C and 11D are top and cross-sectional views taken along lines A-A', B-B', C-C' and D-D' of FIG. 11, respectively, showing the step of forming an interlayer dielectric layer 134 in the method of forming a semiconductor device according to one embodiment of the present invention. As shown in these figures, a liner 132 is formed on sidewalls of the remaining portion of the first conductive layer 104 and/or on sidewalls of the second conductive layer 126, as shown in FIG. 11C and FIG. 11D. The liner 132 can be formed by thermally oxidizing the remaining portion of the first conductive layer 104 and/or sidewalls of the second conductive layer 126. Then, an interlayer dielectric layer 134 fills the opening 129 (i.e. the opening formed by removing the first conductive layer 104) and covers the second conductive layer 126. The interlayer dielectric layer 134 can be an electrical isolation layer for a subsequent conductive layer.

Although specific embodiments have been illustrated and described, it will be obvious to those skilled in the art that various modifications may be made without departing from what is intended to be limited solely by the appended claims.

What is claimed is:

1. A method for forming a semiconductor device, comprising:

providing a substrate;

forming a patterned stack on said substrate, said patterned stack comprising a first dielectric layer on said substrate, a first conductive layer on said first dielectric layer and a mask layer on said first conductive layer, wherein a width of said mask layer is smaller than a width of said first conductive layer;

forming a second dielectric layer on sidewalls of said patterned stack;

forming a third dielectric layer on said substrate;

forming a second conductive layer over said substrate, and removing said mask layer and a portion of said first conductive layer covered by said mask layer to form an opening so as to partially expose said first conductive layer.

2. The method for forming a semiconductor device of claim 1, wherein said step of forming said patterned stack comprises forming dielectric isolations in said first conductive layer, said first dielectric layer, and said substrate before forming said mask layer.

3. The method for forming a semiconductor device of claim 2, wherein said step of forming said dielectric isolations comprises:

forming a plurality of parallel trenches in said first conductive layer, said first dielectric layer, and said substrate along a first direction;

filling said trenches with a dielectric material to form said dielectric isolations; and planarizing said dielectric isolations, so that said dielectric isolations and said first conductive layer are substantially coplanar.

4. The method for forming a semiconductor device of claim 3, wherein said step of forming said patterned stack comprises:

forming a patterned photoresist on said mask layer, said patterned photoresist defining an opening along a second direction perpendicular to said first direction;

etching said mask layer to expose a portion of said first conductive layer by using said patterned photoresist layer as a mask;

forming a spacer on sidewalls of said mask layer;

etching said first conductive layer and said first dielectric layer to expose said substrate by using said spacer and said mask layer as a mask; and removing said spacer to form said patterned stack.

5. The method for forming a semiconductor device of claim 4, further comprising laterally etching back said mask layer before said step of forming said spacer.

6. The method for forming a semiconductor device of claim 4, wherein said step of removing said spacer is performed by a wet etching process.

7. The method for forming a semiconductor device of claim 2, further comprising etching back said dielectric isolations after removing said mask layer.

8. The method for forming a semiconductor device of claim 1, wherein said step of forming said second dielectric layer comprises:

forming a conformal dielectric layer on said patterned stack; and removing said conformal dielectric layer on said substrate.

9. The method for forming a semiconductor device of claim 1, wherein said step of forming said third dielectric layer comprises thermally oxidizing said substrate.

10. The method for forming a semiconductor device of claim 1, wherein said step of forming said second conductive layer comprises:

forming a conductive layer over said substrate and covering said patterned stack; and planarizing said conductive layer to expose said mask layer.

11. The method for forming a semiconductor device of claim 1, before said step of removing said mask layer and a portion of said first conductive layer covered by said mask layer, further comprising:

etching back said second conductive layer, so that a surface of said second conductive layer is lower than a surface of said mask layer; and forming a protective layer on said second conductive layer to expose said mask layer.

12. The method for forming a semiconductor device of claim 11, further comprising removing said protective layer.

13. A method for forming a semiconductor device, comprising:

providing a substrate;

forming a first dielectric layer on said substrate;

forming a first conductive layer on said first dielectric layer;

forming dielectric isolations in said first conductive layer, said first dielectric layer, and said substrate along a first direction;

forming a mask layer on said first conductive layer;

patterning said mask layer along a second direction perpendicular to said first direction;

forming a spacer on said patterned mask layer;

exposing a portion of said substrate;

removing said spacer;

forming a conformal dielectric layer over said substrate with said mask layer, said first conductive layer, and said dielectric layer;

removing said conformal dielectric layer on said substrate to expose a portion of said substrate;

forming a third dielectric layer on said substrate;

forming a second conductive layer over said substrate and covering said mask layer and said first conductive layer; and removing said mask layer and a portion of said first conductive layer covered by said mask layer to form an opening exposing a remaining portion of said first conductive layer.

14. The method for forming a semiconductor device of claim 13, wherein said step of forming said dielectric isolations comprises:

forming a plurality of parallel trenches in said first conductive layer, said first dielectric layer, and said substrate along a first direction;

filling said trenches with a dielectric material to form said dielectric isolations; and planarizing said dielectric isolations, so that said dielectric isolations and said first conductive layer are substantially coplanar.

15. The method for forming a semiconductor device of claim 13, wherein said step of patterning said mask layer comprises:

forming a patterned photoresist on said mask layer, said patterned photoresist defining an opening along a second direction perpendicular to said first direction; and etching said mask layer to expose a portion of said first conductive layer by using said patterned photoresist as a mask.

16. The method for forming a semiconductor device of claim 15, wherein said step of forming said second conductor layer comprises:

forming a conductive layer over said substrate, and planarizing said conductive layer to expose said mask layer.

17. The method for forming a semiconductor device of claim 15, before said step of removing said mask layer and a portion of said first conductive layer covered by said mask layer, further comprising:

etching back said second conductive layer, so that a surface of said second conductive layer is lower than a surface of said mask layer; and forming a protective layer on said second conductive layer to expose said mask layer.

18. The method for forming a semiconductor device of claim 17, further comprising removing said protective layer.

19. The method for forming a semiconductor device of claim 17, further comprising:

etching back said dielectric isolations after said step of removing said mask layer;

thermally oxidizing said first conductive layer to form a liner on sidewalls of said remaining portion of said first conductive layer; and forming an interlayer dielectric layer filling said opening and covering said second conductive layer.

20. The method for forming a semiconductor device of claim 13, further comprising laterally etching back said mask layer before said step of forming said spacer.

* * * * *